(12) United States Patent
Lee et al.

(10) Patent No.: US 11,257,998 B2
(45) Date of Patent: Feb. 22, 2022

(54) SEMICONDUCTOR ELEMENT PACKAGE AND AUTOFOCUSING DEVICE

(71) Applicant: LG INNOTEK CO., LTD., Seoul (KR)

(72) Inventors: Keon Hwa Lee, Seoul (KR); Do Yub Kim, Seoul (KR); Myung Sub Kim, Seoul (KR); Baek Jun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 44 days.

(21) Appl. No.: 16/496,304

(22) PCT Filed: Mar. 21, 2018

(86) PCT No.: PCT/KR2018/003258
§ 371 (c)(1),
(2) Date: Sep. 20, 2019

(87) PCT Pub. No.: WO2018/174239
PCT Pub. Date: Sep. 27, 2018

(65) Prior Publication Data
US 2021/0104648 A1 Apr. 8, 2021

(30) Foreign Application Priority Data

Mar. 21, 2017 (KR) .................. 10-2017-0035406
Oct. 13, 2017 (KR) .................. 10-2017-0133378

(51) Int. Cl.
*H01L 33/62* (2010.01)
*H01L 33/38* (2010.01)
*H01L 33/58* (2010.01)

(52) U.S. Cl.
CPC .............. *H01L 33/62* (2013.01); *H01L 33/38* (2013.01); *H01L 33/58* (2013.01)

(58) Field of Classification Search
CPC . H01L 33/58; H01L 51/5275; H01L 51/5268; H01L 33/62
See application file for complete search history.

(56) References Cited

U.S. PATENT DOCUMENTS 8,773,006 B2   7/2014  Kim et al.
10,244,604 B2  3/2019  Steinkamp et al.
(Continued)

FOREIGN PATENT DOCUMENTS

CN    103296043 A  *  9/2013
EP    2 562 832 A2    2/2013
(Continued)

*Primary Examiner* — Shih Tsun A Chou
*Assistant Examiner* — Peter M Albrecht
(74) *Attorney, Agent, or Firm* — Birch, Stewart, Kolasch & Birch, LLP

(57) ABSTRACT

A semiconductor element package includes: a semiconductor element arranged above a first substrate; first and second electrodes arranged above the first substrate and electrically connected to the semiconductor element; a housing which is arranged above the first substrate and arranged around the semiconductor element, and which has a stepped portion in the upper area thereof; a diffusion part arranged on the stepped portion of the housing and arranged above the semiconductor element; and a plurality of via holes penetrating the first substrate and the housing.

8 Claims, 20 Drawing Sheets

(56) References Cited

U.S. PATENT DOCUMENTS

| | | |
|---|---|---|
| 2009/0072381 A1 | 3/2009 | Ishihara et al. |
| 2010/0127302 A1 | 5/2010 | Kim et al. |
| 2014/0160754 A1 | 6/2014 | Lee et al. |
| 2014/0361200 A1 | 12/2014 | Rudmann et al. |
| 2019/0278104 A1* | 9/2019 | Chen ...................... H01L 33/58 |

FOREIGN PATENT DOCUMENTS

| | | |
|---|---|---|
| JP | 2000-260896 A | 9/2000 |
| JP | 2015-508509 A | 3/2015 |
| KR | 10-2008-0102271 A | 11/2008 |
| KR | 10-2010-0060492 A | 6/2010 |
| KR | 10-1467959 B1 | 12/2014 |
| WO | WO 2014/018684 A1 | 1/2014 |
| WO | WO 2016/120176 A1 | 8/2016 |

* cited by examiner

SEMICONDUCTOR ELEMENT PACKAGE AND AUTOFOCUSING DEVICE

CROSS REFERENCE TO RELATED APPLICATIONS

This application is the National Phase of PCT International Application No. PCT/KR2018/003258, filed on Mar. 21, 2018, which claims priority under 35 U.S.C. 119(a) to Patent Application No. 10-2017-0035406, filed in the Republic of Korea on Mar. 21, 2017 and Patent Application No. 10-2017-0133378, filed in the Republic of Korea on Oct. 13, 2017, all of which are hereby expressly incorporated by reference into the present application.

TECHNICAL FIELD

An embodiment relates to a semiconductor element package and an autofocusing device including the semiconductor element package.

BACKGROUND ART

Semiconductor elements including compounds such as GaN, AlGaN, and the like can have many advantages such as wide and easily adjustable band gap energy and the like and can be variously used for semiconductor devices, light-receiving elements, and various diodes.

In particular, light emitting devices such as light-emitting diodes or laser diodes using a compound semiconductor material including a Group III-V element or a Group I-VI element have advantages that can realize various colors of light such as red light, green light, blue light, and ultraviolet light with the development of thin film growth technology and element materials. In addition, the light emitting devices such as light-emitting diodes or laser diodes using a compound semiconductor material including a Group III-V element or a Group II-VI element can realize white light having high efficiency b) using a fluorescent material or combining colors. The light emitting elements have advantages such as low power consumption, semi-permanent lifetime, last response speed, safety, and environmental friendliness as compared to the conventional light sources such as fluorescent lamps, incandescent lamps, and the like.

In addition, light-receiving elements such as photodetectors or solar cells, which are manufactured using a compound semiconductor material including a Group III-V element or a Group II-VI element, can utilize light in various wavelength ranges from gamma rays to radio wavelengths by generating a photoelectric current by absorbing light in various wavelength ranges with the development of element materials. Further, the light-receiving elements have advantages such as fast response speed, safety, environmental friendliness, and simple control of element materials and thus can be easily used for power control, microwave circuits, or communication modules.

Therefore, semiconductor devices are increasingly applied to transmission modules of optical communication means, light-emitting diode backlights replacing cold-cathode fluorescent lamps (CCFLs) constituting backlights of liquid-crystal display (LCD) devices, white light-emitting diode lighting devices that can replace fluorescent lamps or incandescent bulbs, automotive headlights, traffic lights, and sensors that detect gas and fire. Further, the semiconductor devices can be widely applied to high frequency application circuits, other power control devices, and communication modules.

A light emitting device may be, for example, provided as a p-n junction diode having a characteristic in which electric energy is converted into light energy using a Group III-V element or a Group II-VI element on the periodic table, and may realize various wavelengths by adjusting a composition ratio of a compound semiconductor.

Semiconductor devices are required to have high output and high voltage drive as their application fields are diversified. A temperature of a semiconductor device package is often raised by heat generated from the semiconductor devices due to the high power and the high voltage drive of the semiconductor devices.

Thus, a method for efficiently dissipating the heat generated from the semiconductor device package is required. In addition, there is a strong demand for miniaturization of the semiconductor device package in order to miniaturize products. Therefore, there is an increasing demand for the semiconductor device package capable of efficiently dissipating the heat generated from the semiconductor device while being provided in a small size.

In addition, the semiconductor device package may be applied to application fields such as human motion recognition. In this case, when strong light provided from the semiconductor device package is directly incident on a person, the person may be injured. When the strong light emitted from the semiconductor device package is directly incident on a human eye, there is a risk that the person may lose sight. Accordingly, research is being conducted on a semiconductor device package which is capable of preventing strong light from being directly incident on a person while being applied to application fields such as human movements.

DISCLOSURE

Technical Problem

An embodiment may provide a semiconductor element package which is provided in a small size and is excellent in heat dissipation characteristics.

An embodiment may provide a semiconductor element package which is excellent in mechanical stability and is capable of safely protecting an element disposed inside thereof from an external impact.

An embodiment may provide a semiconductor element package which is capable of providing high-power light and preventing moisture from penetrating therein.

An embodiment may provide a semiconductor element package which is capable of preventing strong light from being directly incident on a person.

An embodiment may provide an autofocusing device which is provided in a small size, is excellent in heat dissipation characteristics, and is capable of providing light with high output and preventing strong light from being directly incident on a person.

Technical Solution

A semiconductor element package according to an embodiment includes: a first substrate; a semiconductor element disposed on the first substrate; first and second electrodes disposed on the first substrate and electrically connected to the semiconductor element; a housing disposed on the first substrate, disposed around the semiconductor element, and having a step in an upper region thereof; a diffusion part disposed on the step of the housing and disposed on the semiconductor element; and a plurality of via holes passing through the first substrate and the housing.

A semiconductor element package according to an embodiment includes: a first substrate; a semiconductor element disposed on the first substrate; a housing disposed on the first substrate, disposed around the semiconductor element, and having a step in an upper region thereof; a diffusion part disposed on the step of the housing and disposed on the semiconductor element; a second substrate disposed under the first substrate; and a protective layer having a first region disposed along an edge of the diffusion part and a second region extending from the first region and contacting the second substrate via the housing.

A semiconductor element package according to an embodiment includes: a first substrate; a semiconductor element disposed on the first substrate; a housing disposed on the first substrate and disposed around the semiconductor element; a diffusion part disposed on the housing and disposed on the semiconductor element; an electrode pad disposed on an upper surface of the diffusion part; a second substrate disposed under the first substrate and including a first terminal electrically connected to a first region of the electrode pad and a second terminal electrically connected to a second region of the electrode pad; a first connection wiring for electrically connecting the first region of the electrode pad to the first terminal; and a second connection wiring electrically connecting the second region of the electrode pad to the second terminal.

A semiconductor element package according to an embodiment includes: a first substrate; a first electrode disposed on the first substrate; a second electrode disposed on the first substrate and disposed to be spaced apart from the first electrode; a semiconductor element disposed on the first electrode; a connection wiring electrically connected to the second electrode and the semiconductor element; a housing disposed on the first substrate and disposed around the semiconductor element; a diffusion part disposed on the housing and disposed on the semiconductor element; an electrode pad disposed on the diffusion part; a first bonding portion disposed under the first substrate, and electrically connected to the first electrode through a first via hole provided in the first substrate; and a second bonding portion disposed under the first substrate, and electrically connected to the second electrode through a second via hole provided in the first substrate.

An autofocusing apparatus according to an embodiment includes: the semiconductor element package; and a light receiving unit for receiving reflected light of light emitted from the semiconductor element package.

Advantageous Effects

According to a semiconductor element package according to an embodiment, there is an advantage that heat dissipation characteristic is excellent while being provided small in size.

According to a semiconductor element package according to an embodiment, there is an advantage that mechanical stability is excellent and an element disposed inside thereof may be safely protected from an external impact.

According to a semiconductor element package according to an embodiment, there is an advantage that light of high power is provided and moisture is prevented from penetrating therein.

According to a semiconductor element package according to an embodiment, there is an advantage that strong light may be prevented from being directly incident on a person.

According to an autofocusing apparatus of an embodiment, there is an advantage that it is provided in a small size, has excellent heat dissipation characteristics, and may provide high output light, and may prevent strong light from being directly incident on a person.

MODES OF THE INVENTION

In the description of embodiments, it will be understood that when a layer (or film), region, pattern or structure is referred to as being "on/over" or "under" another layer (or film), region, pattern or structure, the terminologies of "on/over" and "under" include both the meanings of "directly" and "by interposing another layer (indirectly)". Further, the reference with respect to on/over" or "under" each layer will be made on the basis of drawings.

Hereinafter, a semiconductor element package and an autofocusing apparatus including a semiconductor element package according to an embodiment will be described in detail with reference to accompanying drawings.

Exemplary Embodiment 1

Figure 1:
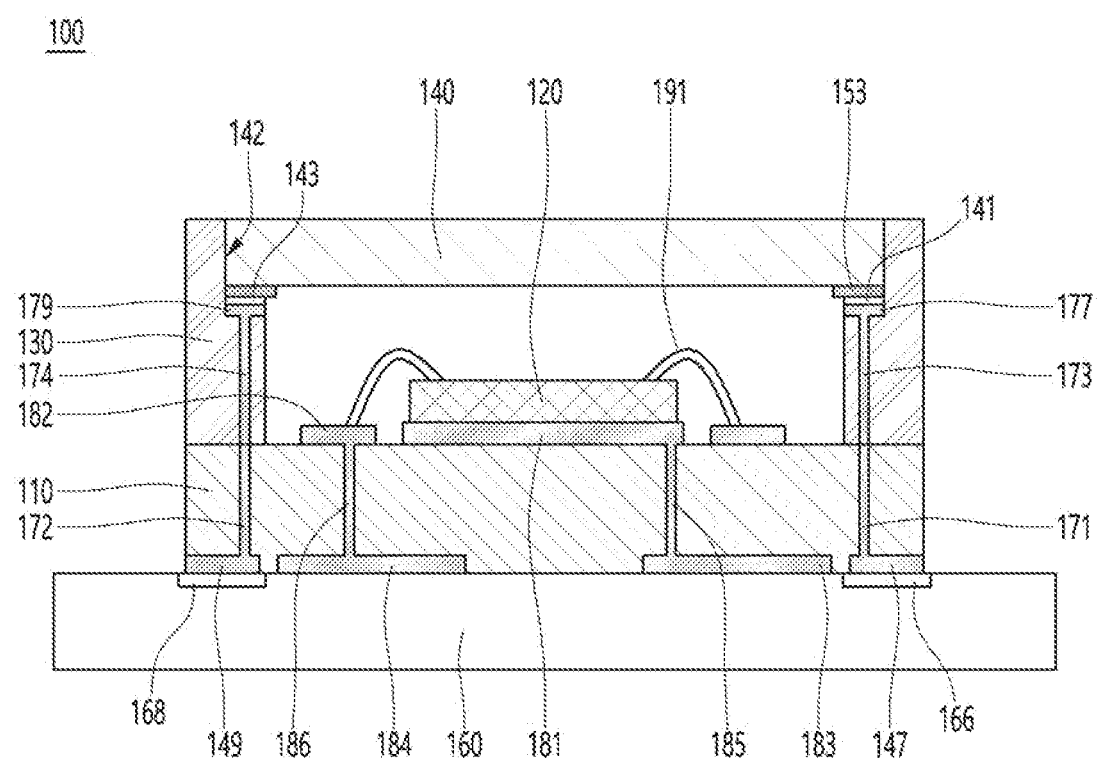
FIG. 1 is a cross-sectional view illustrating a semiconductor element package according to a first embodiment.
Figure 2:
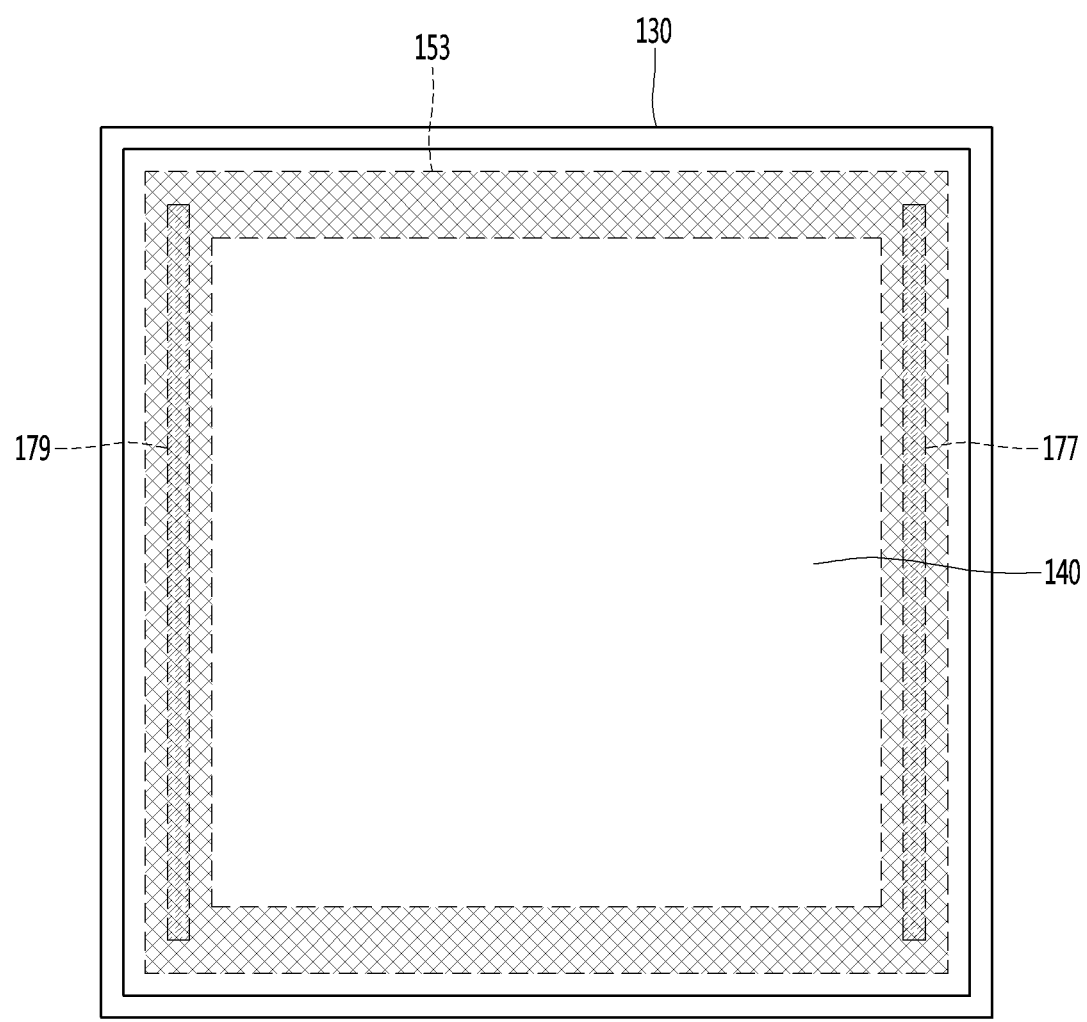
FIG. 2 is a plan view illustrating an example of the semiconductor element package according to the first embodiment.
Figure 3:
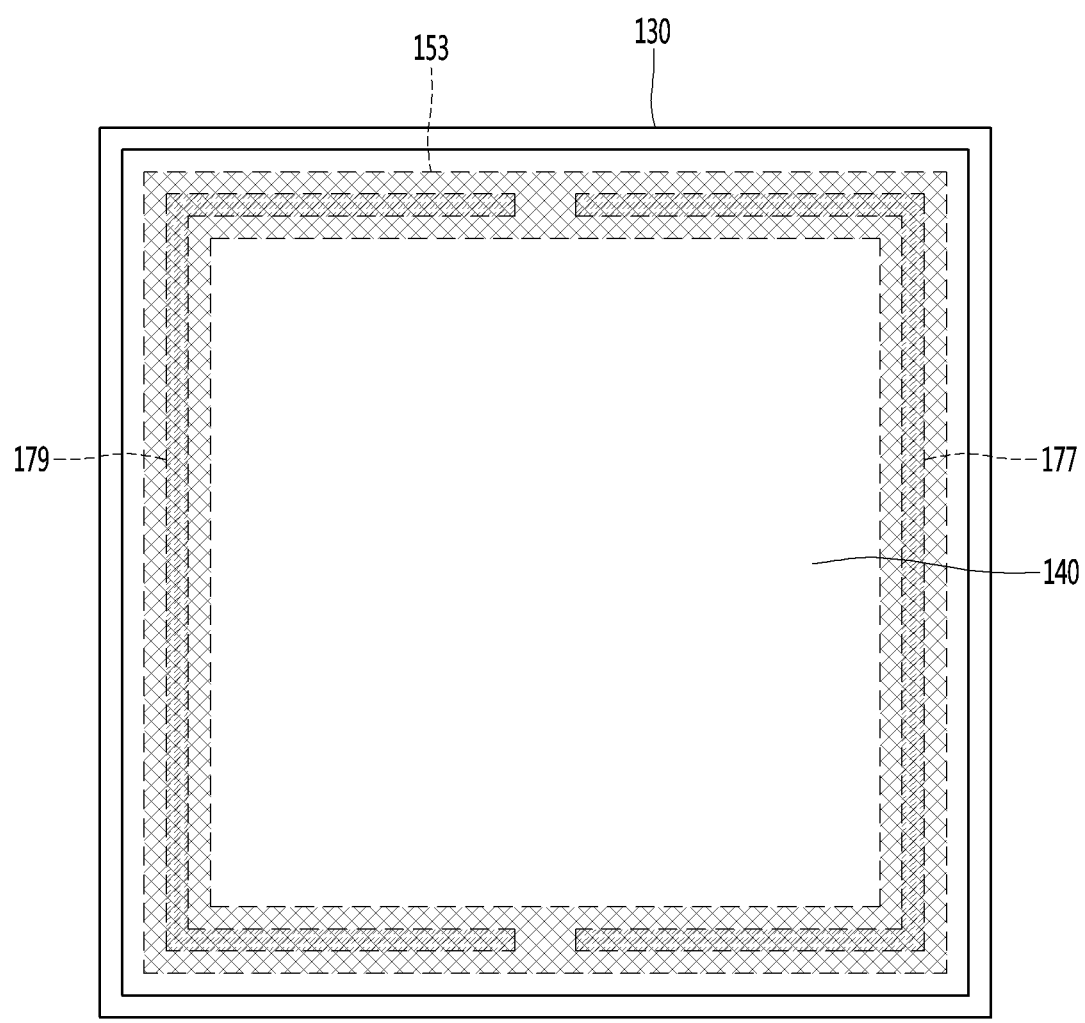
FIG. 3 is a plan view illustrating another example of the semiconductor element package according to the first embodiment.
Figure 4:
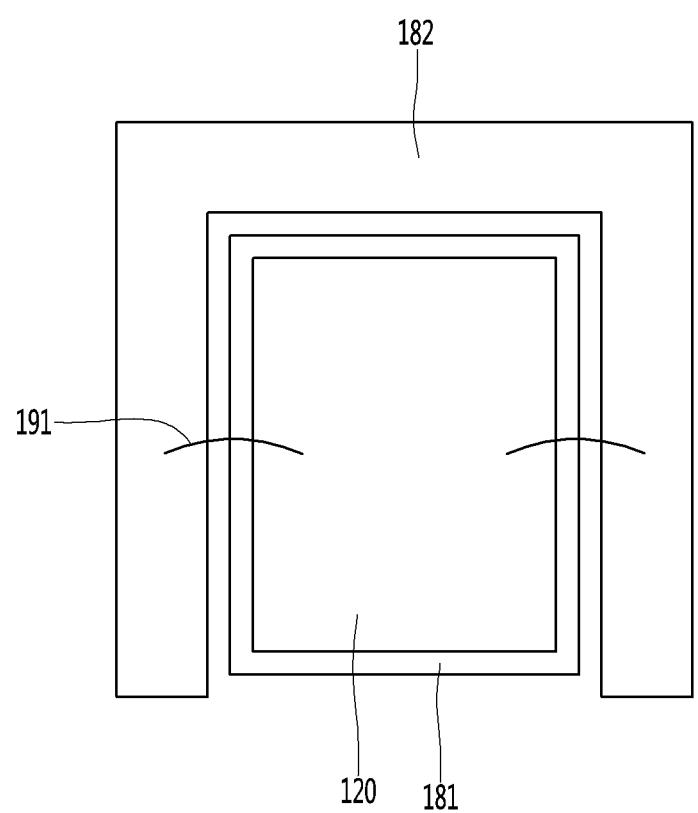
FIG. 4 is a view illustrating an electrical connection relationship between a semiconductor element and an electrode applied to the semiconductor element package according to the first embodiment.

A semiconductor element package according to an embodiment will be described with reference to FIGS. 1 to 4. FIG. FIG. 1 is a cross-sectional view illustrating a semiconductor element package according to a first embodiment, FIG. 2 is a plan view illustrating an example of the semiconductor element package according to the first embodiment. FIG. 3 is a plan view illustrating another example of the semiconductor element package according to the first embodiment, and FIG. 4 is a view illustrating an electrical connection relationship between a semiconductor element and an electrode applied to the semiconductor element package according to the first embodiment.

A semiconductor element package 100 according to the first embodiment may include a substrate 110 and a semiconductor element 120 disposed on the substrate 110.

The substrate 110 may include a material having a high thermal conductivity. The substrate 110 may be provided with a material having excellent heat dissipation characteristics so as to efficiently discharge heat generated in the semiconductor element 120 to the outside thereof. The substrate 110 may include an insulating material.

For example, the substrate 110 may include a ceramic material. The substrate 110 may include a low temperature co-fired ceramic (LTCC) or a high temperature co-fired ceramic (HTCC) that is co-fired.

In addition, the substrate 110 may include a metal compound. The substrate 110 may include a metal oxide having a thermal conductivity of 140 W/mK or more. For example, the substrate 110 may include aluminum nitride (AlN) or alumina ($Al_2O_3$).

As another example, the substrate 110 may include a resin-based insulating material. The substrate 110 may be provided with a silicone resin, an epoxy resin, a thermosetting resin including a plastic material, or a high heat-resistant material.

The substrate 110 may include a conductive material. When the substrate 110 is provided with a conductive material, for example, a metal, an insulating layer may be provided for electrical insulation between the substrate 110 and the semiconductor element 120.

The semiconductor element 120 according to the first embodiment may be selected from a light emitting device including a light emitting diode device and a laser diode device. As an example, the semiconductor element 120 may be a vertical cavity surface emitting laser (VCSEL) semiconductor element. The VCSEL semiconductor element may emit beams in a direction perpendicular to a top surface thereof. The VCSEL semiconductor element may emit beams upward in a beam angle of, for example, about 15 to 25 degrees. The VCSEL semiconductor element may include a single light emitting aperture or multiple light emitting apertures that emit a circular beam. An example of the VCSEL semiconductor element will be described later.

The semiconductor element package 100 according to the first embodiment may further include a housing 130. The housing 130 may be disposed on the substrate 110. The housing 130 may be disposed around the semiconductor element 120.

The housing 130 may include a material having a high thermal conductivity. The housing 130 may be provided with a material having excellent heat dissipation characteristics so as to efficiently discharge heat generated in the semiconductor element 120 to the outside thereof. The housing 130 may include an insulating material.

For example, the housing 130 may include a ceramic material. The housing 130 may include a low temperature co-fired ceramic (LTCC) or a high temperature co-fired ceramic (HTCC) that is co-fired.

In addition, the housing 130 may include a metal compound. The housing 130 may include a metal oxide having a thermal conductivity of 140 W/mK or more. For example, the housing 130 may include aluminum nitride (AlN) or alumina ($Al_2O_3$).

As another example, the housing 130 may include a resin-based insulating material. The housing 130 may be provided with a silicone resin, an epoxy resin, a thermosetting resin including a plastic material, or a high heat-resistant material.

The housing 130 may include a conductive material. The housing 130 may be provided with a conductive material, for example, a metal.

As an example, the housing 130 may include the same material as that of the substrate 110. When the housing 130 is formed of the same material as that of the substrate 110, the housing 130 may be formed integrally with the substrate 110.

In addition, the housing 130 may be formed of a material different from that of the substrate 110.

According to the semiconductor element package 100 according to the first embodiment, the substrate 110 and the housing 130 may be provided with a material having excellent heat dissipation characteristics. Accordingly, heat generated in the semiconductor element 120 may be effectively discharged to the outside thereof.

According to the first embodiment, when the substrate 110 and the housing 130 are provided and coupled as separate parts, an adhesive layer may be provided between the substrate 110 and the housing 130.

As an example, the adhesive layer may include an organic material. The adhesive layer may include an epoxy-based resin. In addition, the adhesive layer may include a silicone-based resin.

The semiconductor element package 100 including a substrate 110 and a housing 130 may be manufactured, for example, by a wafer level package process. That is, the semiconductor element 120 and the housing 130 are attached onto the substrate 110 at a wafer level, and a plurality of semiconductor element packages in which the semiconductor element 120 and the housing 130 are coupled to the substrate 110 by a cutting method such as dicing or the like may be provided.

As described above, when the semiconductor element package 100 including the substrate 110 and the housing 130 is manufactured by a wafer level package process, an outer surface of the substrate 110 and an outer surface of the housing 130 may be formed in the same plane. That is, there is no a step between the outer surface of the substrate 110 and the outer surface of the housing 130.

According to the first embodiment, since there is no step between the outer surface of the substrate 110 and the outer surface of the housing 130, it is possible to fundamentally prevent a failure caused by moisture permeation due to a step structure and damage due to external friction and the like in a conventional semiconductor element package.

The substrate 110 may be referred to as a first substrate and the housing 130 may be referred to as a second substrate. Alternatively, the substrate 110 may be referred to as a first body and the housing 130 may be referred to as a second body.

The semiconductor element package 100 according to the first embodiment may further include a first electrode 181 and a second electrode 182 disposed on the substrate 110. The first electrode 181 and the second electrode 182 may be disposed to be spaced apart from each other on the substrate 110.

As an example, the semiconductor element 120 may be disposed on the first electrode 181. The semiconductor element 120 may be provided on the first electrode 181 by, for example, a die bonding method.

As shown in FIG. 4, an area of the first electrode 181 may be equal to or larger than that of the semiconductor element 120.

The second electrode 182 may have a ⊏-shape. The second electrode 182 may be disposed to surround the first electrode 181. Specifically, when a first side and a second side of the first electrode 181 face each other and a third side and a fourth side face each other, the second electrode 182 may be disposed to be spaced apart from the first side of the first electrode 181, disposed to be spaced apart from the third side of the first electrode 181, and disposed to be spaced apart from the second side of the first electrode 181.

The semiconductor element 120 may be electrically connected to the second electrode 182. As an example, the semiconductor element 120 and the second electrode 182 may be electrically connected by a wire 191. The semiconductor element 120 may be electrically connected to the second electrode 182 by a plurality of wires. The semiconductor element 120 may be electrically connected to the second electrode 182 by the wire 191.

A number of wires connecting the semiconductor element 120 and the second electrode 182 and a connection position thereof may be selected by a size of the semiconductor element 120 or a degree of current diffusion required in the semiconductor element 120.

The semiconductor element package 100 according to the first embodiment may include a first bonding portion 183 and a second bonding portion 184 disposed under the substrate 110. For example, the first bonding portion 183 and the second bonding portion 184 may be electrically connected to a signal line (not shown) of a circuit board 160.

The substrate 110 may be referred to as the first substrate and the circuit board 160 may be referred to as the second substrate. On the other hand, the circuit board 160 may be referred to as the first substrate and the substrate 110 may be referred to as the second substrate. The housing 130 may be referred to as a third substrate.

The first bonding portion 183 and the second bonding portion 184 may be disposed to be spaced apart from each other under the substrate 110. The first bonding portion 183 and the second bonding portion 184 may have circular pads, but the present invention is not limited thereto.

The first bonding portion 183 may be disposed on a lower surface of the substrate 110. The first bonding portion 183 may be electrically connected to the first electrode 181. The first bonding portion 183 may be electrically connected to the first electrode 181 through a first connection wiring 185. The first connection wiring 185 may be disposed, for example, in a first via hole provided in the substrate 110.

The second bonding portion 184 may be disposed on the lower surface of the substrate 110. The second bonding portion 184 may be electrically connected to the second electrode 182. The second bonding portion 184 may be electrically connected to the second electrode 182 through a second connection wiring 186. The second connection wiring 186 may be disposed, for example, in a second via hole provided in the substrate 110.

For example, the first connection wiring 185 and the second connection wiring 186 may include tungsten (W), but the present invention is not limited thereto. The tungsten (W) may be melted at a high temperature of 1000° C. or more and then injected into first and second via holes and cured to form the first connection wiring 185 and the second connection wiring 186.

According to the embodiment, driving power may be supplied to the semiconductor element 120 through the circuit board 160.

The semiconductor element package 100 according to the first embodiment described above has been described based on a case in which the semiconductor element 120 is connected to the first electrode 181 by a die bonding method and connected to the second electrode 182 by a wire bonding method.

However, a manner in which the driving power is supplied to the semiconductor element 120 may be variously modified and applied. For example, the semiconductor element 120 may be electrically connected to the first electrode 181 and the second electrode 182 by a flip chip bonding method. In addition, the semiconductor element 120 max be electrically connected to the first electrode 181 and the second electrode 182 by a wire bonding method.

Meanwhile, a step may be provided in an upper region of the housing 130. For example, a recessed region 142 may be provided in the upper region of the housing 130. As an example, a width and/or depth of the recessed region 142 may be provided by several hundred micrometers.

A diffusion part 140 may be disposed in the recessed region 142. The diffusion part 140 may be supported by the recessed region 142 provided in an upper portion of the housing 130.

An adhesive layer (not shown) may be provided between the housing 130 and the diffusion part 140 in the recessed region 142. As an example, the adhesive layer may be provided on a lower surface and a side surface of the diffusion part 140, which is in contact with an inner surface of the recessed region 142.

The semiconductor element package 100 according to the first embodiment may further include a diffusion part 140. The diffusion part 140 may be disposed on the semiconductor element 120. The diffusion part 140 may be disposed to be spaced apart from the semiconductor element 120. The diffusion part 140 may be disposed on the housing 130. Specifically, the diffusion part 140 may be seated in the recessed region 142 of the housing 130. The diffusion part 140 may be supported by the recessed region 142 of the housing 130.

The diffusion part 140 may extend an angle of view of a beam of light emitted from the semiconductor element 120. The diffusion part 140 may include, for example, a microlens, a concavo-convex pattern, and the like. The microlens, the concavo-convex pattern, and the like may be disposed on an upper surface or the lower surface of the diffusion part 140. The microlens, the concavo-convex pattern, and the like may be integrally formed with the diffusion part 140 or may be formed separately.

The diffusion part 140 may set the angle of view of the beam differently depending on an application field of the semiconductor element package 100. The diffusion part 140 may set intensity of the light depending on the application field of the semiconductor element package 100.

The diffusion part 140 may include an anti-reflective function. For example, the diffusion part 140 may include an anti-reflective layer disposed on one surface facing the semiconductor element 120. The anti-reflective layer may be formed separately from the diffusion part 140. The diffusion part 140 may include the anti-reflective layer disposed on a lower surface facing the semiconductor element 120. The anti-reflective layer prevents light incident from the semiconductor element 120 from being reflected from a surface of the diffusion part 140 and transmits the light into the diffusion part 140, thereby improving light loss due to reflection.

The anti-reflective layer may be formed of, for example, an anti-reflective coating film and attached to a surface of the diffusion part 140. The anti-reflective layer may be formed on the surface of the diffusion part 140 through spin coating, spray coating, or the like. As an example, the anti-reflective layer may be formed as a single layer or multiple layers including at least one of the group including $TiO_2$, $SiO_2$, $Al_2O_3$, $Ta_2O_3$, $ZrO_2$, and $MgF_2$.

The semiconductor element package 100 according to the first embodiment may further include an adhesive layer provided between the diffusion part 140 and the recessed region 142 of the housing 130. As an example, the adhesive layer may include an organic material. The adhesive layer may include an epoxy-based resin. In addition, the adhesive layer may include a silicone-based resin.

Meanwhile, as described above, the substrate 110 and the housing 130 may be manufactured by the wafer level package process. According to the embodiment, the diffusion part 140 may also be attached onto the housing 130 by the wafer level package process.

That is, after the semiconductor element 120 and the housing 130 are attached onto the substrate 110 at the wafer level and the diffusion part 140 is attached onto the housing 130, a plurality of semiconductor element packages in which the semiconductor element 120, the housing 130, and the diffusion part 140 are coupled to the substrate 110 by a cutting method such as dicing or the like may be provided.

As described above, when the semiconductor element package 100 including the substrate 110, the housing 130, and the diffusion part 140 is manufactured by the wafer level package process, the outer surface of the substrate 110, the outer surface of the housing 130, and the outer surface of the diffusion part 140 are formed in the same plane. That is, there is no step between the outer surface of the substrate 110, the outer surface of the housing 130, and the outer surface of the diffusion part 140.

The semiconductor element package 100 according to the first embodiment may further include a third connection wiring 171 and a fourth connection wiring 172 disposed in a third via hole and a fourth via hole, respectively. The third via hole and the fourth via hole may be formed in the substrate 110. The third via hole may be formed closer to an edge of the substrate 110 than the first via hole in which the first connection wiring 185 is disposed. The fourth via hole may be formed closer to the edge of the substrate 110 than the second via hole in which the second connection wiring 186 is disposed. The third connection wiring 171 and the fourth connection wiring 172 may be disposed inside the substrate 110.

The semiconductor element package 100 according to the first embodiment may further include a third bonding portion 147 and a fourth bonding portion 149 disposed on the lower surface of the substrate 110.

The third bonding portion 147 and the fourth bonding portion 149 may be collectively formed by the same bonding process as the first bonding portion 183 and the second bonding portion 184, but the present invention is not limited thereto. In this case, the first to fourth bonding portions 183, 184, 147, and 149 may include the same metal material as one another, but the present invention is not limited thereto.

The semiconductor element package 100 according to the first embodiment may further include a circuit board 160 including at least one signal line. For example, the circuit board 160 includes first to fourth signal lines, and the first bonding portion 183 and the second bonding portion 184 are electrically connected to the first signal line and the second signal line, and the third bonding portion 147 and the fourth bonding portion 149 may be electrically connected to the third signal line 166 and the fourth signal line 168.

Meanwhile, the first signal line and the second signal line may be referred to as a third signal line 165 and a fourth signal line 167, respectively, and the third signal line 165 and the fourth signal line 167 may also be referred to as the first signal line and the second signal line, respectively.

The semiconductor element package 100 according to the first embodiment may further include a fifth connection wiring 173 and a sixth connection wiring 174 disposed in a fifth via hole and a sixth via hole, respectively. The fifth via hole and the sixth via hole may be formed in the housing 130. The fifth connection wiring 173 and the sixth connection wiring 174 may be disposed inside the housing 130.

The ordering of the first to sixth connection wirings 185, 186, 171 to 174 may be changed. For example, the third connection wiring 171 may be referred to as the first connection wiring 185, and the fourth connection wiring 172 may be referred to as the second connection wiring 186. For example, the first connection wiring 185 may be referred to as the third connection wiring 171, and the second connection wiring 186 may be referred to as the fourth connection wiring 172.

The third connection wiring 171 may be disposed in line with the fifth connection wiring 173 along a vertical direction, and the fourth connection wiring 172 may be disposed with the sixth connection wiring 174 along the vertical direction, but the present invention is not limited thereto.

Meanwhile, the third via hole formed in the substrate 110 and the fifth via hole formed in the housing 130 may not be formed in a line along the vertical direction. That is, the third via hole formed in the substrate 110 and the fifth via hole formed in the housing 130 may be formed to be shifted. In this case, the third connection wiring 171 disposed in the third via hole and the fifth connection wiring 173 disposed in the fifth via hole may be arranged to be shifted as well.

In addition, the fourth via hole formed in the substrate 110 and the sixth via hole formed in the housing 130 may not be formed in a line in the vertical direction. That is, the fourth via hole formed in the substrate 110 and the sixth via hole formed in the housing 130 may be formed to be shifted. In this case, the fourth connection wiring 172 disposed in the fourth via hole and the sixth connection wiring 174 disposed in the sixth via hole may be arranged to be shifted as well. Meanwhile, although only one of each of the third to sixth connection wirings 171 to 174 is provided in FIG. 1, a plurality of each of the third to sixth connection wirings 171 to 174 may be provided, and the plurality of third connection wirings 171, fourth connection wirings 172, fifth connection wirings 173, and sixth connection wirings 174 may be disposed to be mutually shifted, but the present invention is not limited thereto.

Although not shown, a pad for electrically connecting the third connection wiring 171 and the fifth connection wiring 173 may be disposed between an upper surface of the substrate 110 and a lower surface of the housing 130, and another pad for electrically connecting the fourth connection wiring 172 and the sixth connection wiring 174 may be disposed between the upper surface the substrate 110 and the lower surface of the housing 130. Both the pad and the other pad may include a conductive material, for example, a metal material.

The semiconductor element package 100 according to the first embodiment may further include a fifth bonding portion 177 and a sixth bonding portion 179 disposed on the housing 130.

The fifth bonding portion 177 and the sixth bonding portion 179 may be collectively formed by the same bonding process as the first to fourth bonding portions 183, 184, 147, and 149, but the present invention is not limited thereto. In this case, the first to sixth bonding portions 183, 184, 147, 149, 177, and 179 may include the same metal material as one another, but the present invention is not limited thereto.

The fifth bonding portion 177 may be disposed on one side of the recessed region 142 of the housing 130 and the sixth bonding portion 179 may be disposed on the other side of the recessed region 142 of the housing 130. The one side of the recessed region 142 and the other side of the recessed region 142 may be a bottom surface of the recessed region 142.

The semiconductor element package 100 according to the first embodiment may further include a pad 153 disposed under the diffusion part 140.

The pad 153 may include a conductive material, i.e., a metal material. One side region of the pad 153 may be electrically connected to the fifth bonding portion 177 and another side region of the pad 153 may be electrically connected to the sixth bonding portion 179.

An adhesive layer 141, 143 may be disposed under the pad 153. The adhesive layer may electrically connect the fifth and sixth bonding portions 177 and 179 to the pad 153 using a metal bonding method. That is, the fifth bonding portion 177 may be electrically connected to the one side region of the pad 153 through the adhesive layer 141, 143, and the sixth bonding portion 179 may be electrically connected to the other side region of the pad 153 through the adhesive layer 141 143.

As shown in FIGS. 2 and 3, the pad 153 may be disposed along a periphery of an edge of the lower surface of the diffusion part 140. The pad 153 may have a closed-loop shape.

The fifth bonding portion 177 and the sixth bonding portion 179 may be disposed to be spaced apart from each other. For example, as shown in FIG. 2, the fifth bonding portion 177 and the sixth bonding portion 179 may have a straight shape. As shown in FIG. 3, the fifth bonding portion 177 and the sixth bonding portion 179 may have a ⊏-shape.

A width of the fifth bonding portion 177 or the sixth bonding portion 179 may be equal to or larger than that of the pad 153, but the present invention is not limited thereto.

The third to sixth connection portions and the third to sixth bonding portions 147, 149, 177, and 179 may be referred to as a sensing part that sense deviation of the diffusion part 140.

Figure 5:
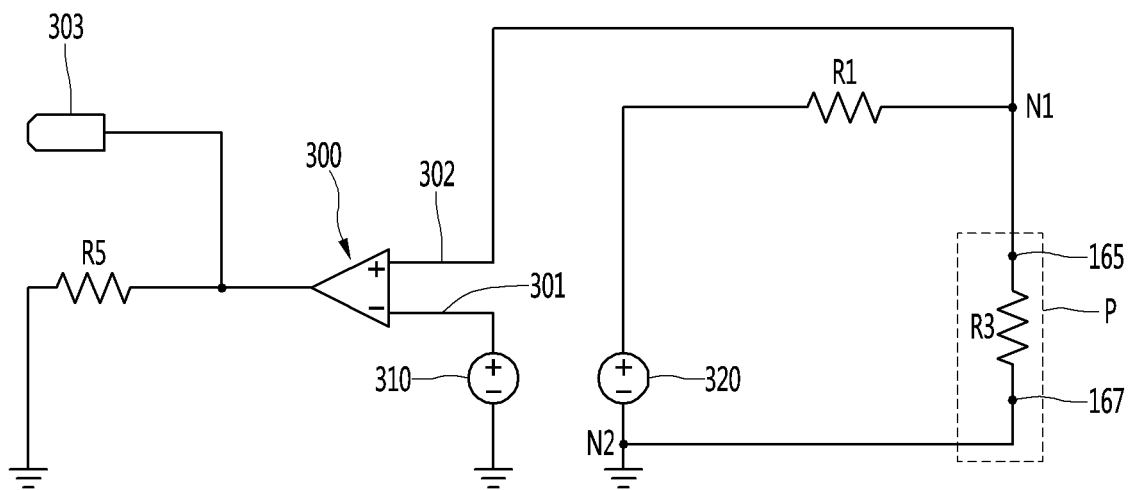
FIG. 5 is a view illustrating an example of a detection circuit applied to the semiconductor element package according to the first embodiment.

A sensing signal sensed by the sensing part may be provided to a detection circuit shown in FIG. 5 to detect whether or not the diffusion part 140 is deviated, and an operation of the semiconductor element 120 may be controlled by a controller according to a detection result. Description thereof has been already described in detail above, so that further description is omitted.

As shown in FIG. 5, the third signal line 165 of the circuit board 160 may be an input terminal and the fourth signal line 167 of the circuit board 160 may be a sensing terminal.

When the diffusion part 140 is not deviated but is stably fixed to the housing 130, a signal provided to the third signal line 165 of the circuit board 160 may be provided to the fourth signal line 167 of the circuit board 160 via the third bonding portion 147, the third connection wiring 171, the fifth connection wiring 173, the fifth bonding portion 177, the pad 153, the sixth bonding portion 179, the sixth connection wiring 174, the fourth connection wiring 172, and the fourth bonding portion 149. A signal provided to the fourth signal line 167 may be provided as a sensing signal to the detection circuit shown in FIG. 5, which will be described later.

On the other hand, when an electrical short has occurred between the pad 153 and one of the fifth and sixth bonding portions 177 and 179 by deviation of the diffusion part 140, a signal provided to the third signal line 165 of the circuit board 160 is provided to the fourth signal line 167 of the circuit board 160.

The detection circuit shown in FIG. 5 may detect or determine whether or not the diffusion part 140 is deviated based on a sensing signal provided from the fourth signal line 167 of the circuit board 160.

The possibility that the diffusion part 140 may be separated from the housing 130 in an extreme environment such as long use of the semiconductor element package or vibration may be raised in the related art. In this case, when the diffusion part 140 is deviated from the housing 130, strong light emitted from the semiconductor element 120 may be directly irradiated to the outside without passing through the diffusion part 140.

In this case, when the semiconductor element package 100 according to the first embodiment is used to detect movement of a person, strong light not passing through the diffusion part 140 may be directly irradiated to a human eye. As an example, when the strong light emitted from the semiconductor element 120 is directly irradiated to the human eye, there is a risk that the person may lose sight.

Therefore, research is being conducted on a reliable method that may prevent the diffusion part 140 from being separated from the housing 130. In addition, under a stochastic assumption that the diffusion part 140 may be separated from the housing 130 in extreme environments, it is required to provide a stable method that may prevent a person from being injured by the strong light emitted from the semiconductor element 120.

The semiconductor element package 100 according to the first embodiment provides a method capable of detecting whether or not the diffusion part 140 and the housing 130 are separated using an electrical signal. According to the first embodiment, there is an advantage that deviation of the diffusion part 140 may be detected quickly by providing a detection method using the electrical signal instead of a physical detection method, and subsequent actions associated therewith may be processed quickly.

That is, according to the semiconductor element package 100 according to the first embodiment, the deviation of the diffusion part 140 may be detected using the electrical signal, and a driving voltage applied to the semiconductor element 120 may be shut off to prevent a beam from being further generated from the semiconductor element 120. Accordingly, it is possible to detect in real time that the diffusion part 140 is deviated from the housing 130, and through the control of the semiconductor element 120, it is possible to fundamentally prevent the strong light emitted from the semiconductor element 120 from being directly irradiated to a person.

Meanwhile, the circuit board 160 may include a detection circuit (see FIG. 5) capable of detecting whether or not the diffusion part 140 is separated from the housing 130. The circuit board 160 may detect whether or not the diffusion part 140 is separated from the housing 130 and control the supply of driving power provided to the semiconductor element 120.

According to the first embodiment, when the diffusion part 140 is detected to be separated from the housing 130, the circuit board 160 may shut off the driving power supplied to the semiconductor element 120. In addition, when the diffusion part 140 is normally attached on the housing 130, the circuit board 160 may maintain the driving power supplied to the semiconductor element 120.

Hereinafter, referring to FIGS. 1 to 5, an example of a method for detecting whether or not the diffusion part 140 is separated from the housing 130 in the semiconductor element package 100 according to the first embodiment, and controlling the driving power supplied to the semiconductor element 120, will be described.

According to the semiconductor element package 100 according to the first embodiment, the circuit board 160 may include a detection circuit. The detection circuit may detect an electrical short between the fifth bonding portion 177 and the pad 153 or an electrical short between the sixth bonding portion 179 and the pad 153. The detection circuit may be electrically connected to the third signal line 165 and the fourth signal line 167 of the circuit board 160.

The detection circuit may include a comparison unit 300, as shown in FIG. 5. The comparison unit 300 may include a first input terminal 301, a second input terminal 302, and an output terminal 303. As an example, the comparison unit 300 may include an operational amplifier (OP Amp).

The comparison unit 300 may compare a first voltage value input to the first input terminal 301 with a second voltage value input to the second input terminal 302 to provide an amplified signal to the output terminal 303.

As an example, when the first voltage value input to the first input terminal 301 is larger than the second voltage value input to the second input terminal 302, the comparison unit 300 may provide a "Low" signal indicating "normal" to the output terminal 303. In addition, when the first voltage value input to the first input terminal 301 is smaller than the second voltage value input to the second input terminal 302, the comparison unit 300 may provide a "High" signal indicating "abnormal" to the output terminal 303.

According to an embodiment, as shown in FIG. 5, the detection circuit may include a first power supply unit 310 connected to the first input terminal 301. The first power supply unit 310 may provide a predetermined voltage to the first input terminal 301. As an example, the first power supply unit 310 may be set to supply power of 2 V to the first input terminal 301.

In addition, as shown in FIG. 5, the detection circuit may include a first node N1 connected to the second input terminal 302 and the third signal line 165 of the circuit board 160. The detection circuit may include a first resistor R1 connected in parallel with the third signal line 165 of the circuit board 160 at the first node N1.

Further, as shown in FIG. 5, the detection circuit may include a second power supply unit 320 connected between the first resistor R1 and a ground electrode. The second power supply unit 320 may be selected to provide a greater voltage than the first power supply unit 310. As an example, the second power supply unit 320 may be set to supply power of 5 V.

Furthermore, the detection circuit may include a second node N2 connected between the second power supply unit 320 and the ground electrode and connected to the fourth signal line 167 of the circuit board 160.

The detection circuit may include a region P disposed between the third signal line 165 of the circuit board 160 and the fourth signal line 167 of the circuit board 160 as shown in FIG. 5.

A third resistor R3 disposed between the third signal line 165 of the circuit board 160 and the fourth signal line 167 of the circuit board 160 in the region P may be a resistance value present in the third signal line 165 of the circuit board 160—the third bonding portion 147—the third connection wiring 171—the fifth connection wiring 173—the fifth bonding portion 177—the pad 153—the sixth bonding portion 179—the sixth connection wiring 174—the fourth connection wiring 172—the fourth bonding portion 149—the fourth signal line 167 of the circuit board 160 described with reference to FIG. 4.

As an example, when the diffusion part 140 is normally fixed on the housing 130, since the third signal line 165 of the circuit board 160—the third bonding portion 147—the third connection wiring 171—the fifth connection wiring 173—the fifth bonding portion 177—the pad 153—the sixth bonding portion 179—the sixth connection wiring 174—the fourth connection wiring 172—the fourth bonding portion 149—the fourth signal line 167 of the circuit board 160 is electrically connected to each other, the resistance value of the third resistor R3 may be zero or may have a resistance value close to zero.

As an example, when the diffusion part 140 is separated and deviated on the housing 130, since the third signal line 165 of the circuit board 160—the third bonding portion 147—the third connection wiring 171—the fifth connection wiring 173—the fifth bonding portion 177—the pad 153—the sixth bonding portion 179—the sixth connection wiring 174—the fourth connection wiring 172—the fourth bonding portion 149—the fourth signal line 167 of the circuit board 160 is electrically short-circuited and opened, the value of the third resistor R3 may have a large resistance value. As an example, the third resistor R3 may be measured to have an infinite resistance value or a resistance value of several mega ohms to several tens of mega ohms.

Hereinafter, a method of detecting whether or not the diffusion part 140 is deviated will be described in more detail.

<When Diffusion Part 140 is Normally Fixed on Housing 130>

In this case, since the diffusion part 140 is normally connected on the housing 130, the fifth bonding portion 177 and the pad 153 or the sixth bonding portion 179 and the pad 153 may be normally connected. Accordingly, since the third signal line 165 of the circuit board 160—the third bonding portion 147—the third connection wiring 171—the fifth connection wiring 173—the fifth bonding portion 177—the pad 153—the sixth bonding portion 179—the sixth connection wiring 174—the fourth connection wiring 172—the fourth bonding portion 149—the fourth signal line 167 of the circuit board 160 is electrically connected, the resistance value of the third resistor R3 may have a value close to zero.

That is, since the resistance value of the third resistor R3 in the detection circuit shown in FIG. 5 will have an approximation of zero, the first node N1 will have an approximation of 0 V. As an example, when a voltage of 5 V is applied to the second power supply unit 320, the third resistor R3 has 0.0001 ohms, and the first resistor R1 has 5000 ohms, it is possible to have an approximation of 0 V at the first node N1.

In addition, when a voltage of 2 V is applied to the first power supply unit 310, 2 V may be supplied to the first input terminal 301 and 0 V may be supplied to the second input terminal 302. Accordingly, since the first voltage value input to the first input terminal 301 is larger than the second voltage value input to the second input terminal 302, a "Low" signal indicating "normal" may be supplied to the output terminal 303.

Meanwhile, the circuit board 160 may include a control unit (not shown) that receives a signal output from the comparison unit 300 and controls driving of the semiconductor element 120. The control unit may be included in the detection circuit, but the control unit is not limited thereto. The control unit may be connected to the output terminal 303. Therefore, the control unit may receive a logic value of the detection circuit from the output terminal 303 of the comparison unit 300. That is, when the control unit receives a "Low" signal indicating "normal" from the output terminal 303, the control unit may control to normally supply driving power supplied to the semiconductor element 120.

As an example, the circuit board 160 may include a first signal line electrically connected to the first bonding portion 183 and a second signal line electrically connected to the second bonding portion 184. The circuit board 160 may continuously supply a driving voltage to the semiconductor element 120 through the third signal line 165 and the fourth signal line 167 by the control of the control unit.

<When Diffusion Part 140 is Separated and Deviated from Housing 130>

In this case, since the diffusion part 140 is deviated from the housing 130, a space between the fifth bonding portion 177 and the pad 153 or between the sixth bonding portion 179 and the pad 153 may be electrically short-circuited. Accordingly, since the third signal line 165 of the circuit board 160—the third bonding portion 147—the third connection wiring 171—the fifth connection wiring 173—the fifth bonding portion 177—the pad 153—the sixth bonding portion 179—the sixth connection wiring 174—the fourth connection wiring 172—the fourth bonding portion 149—the fourth signal line 167 of the circuit board 160 is electrically opened, the resistance value of the third resistor R3 will have a large value close to infinity.

That is, since the resistance value of the third resistor R3 has a large value close to infinity in the detection circuit shown in FIG. 5, the first node N1 will have a value corresponding to a voltage applied to the second power supply unit 320. As an example, when a voltage of 5 V is applied to the second power supply unit 320, the third resistor R3 has 10 mega ohms, and the first resistor R1 has 5000 ohms, it is possible to have an approximate value of 5 V at the first node N1.

In addition, when a voltage of 2 V is applied to the first power supply unit 310, 2 V may be supplied to the first input terminal 301 and 5 V may be supplied to the second input terminal 302. Accordingly, since the first voltage value input to the first input terminal 301 is smaller than the second voltage value input to the second input terminal 302, a "High" signal indicating "abnormal" may be supplied to the output terminal 303.

When the control unit receives a "High" signal indicating "abnormal" from the output terminal 303, the control unit may control to shut off the driving power supplied to the semiconductor element 120.

As an example, the circuit board 160 may include the first signal line electrically connected to the first bonding portion 183 and the second signal line electrically connected to the second bonding portion 184. The circuit board 160 may shut off the driving voltage supplied to the semiconductor element 120 through the first signal line and the second signal line under the control of the control unit. Accordingly, the semiconductor element 120 no longer emits a beam.

Therefore, according to the semiconductor element package 100 according to the first embodiment, it is possible to detect that the diffusion part 140 is separated from the housing 130 and to control the semiconductor element 120 not to be driven.

As described above, according to the first embodiment, when it is detected whether the diffusion part 140 is separated or not by using an electrical signal, and that the diffusion part 140 is deviated, the driving voltage applied to the semiconductor element 120 may be shut off. Accordingly, in the semiconductor element package 100 according to the first embodiment, since it may be detected in real time that the diffusion part 140 is deviated from the housing 130, and the driving voltage applied to the semiconductor element 120 may be controlled in real time, it is possible to fundamentally prevent the strong light emitted from the semiconductor element 120 from being directly irradiated to a person.

Meanwhile, as another example, when the first voltage value input to the first input terminal 301 is larger than the second voltage value input to the second input terminal 302, the comparison unit 300 may be set to provide a "High" signal indicating "normal" to the output terminal 303. In addition, when the first voltage value input to the first input terminal 301 is smaller than the second voltage value input to the second input terminal 302, the comparison unit 300 may be set to provide a "Low" signal indicating "abnormal" to the output terminal 303.

According to the first embodiment, since there is no step between an outer surface of the substrate 110, an outer surface of the housing 130, and an outer surface of the diffusion part 140, it is possible to fundamentally prevent a defect that causes damage due to moisture permeation, external friction, and the like due to a step structure in the conventional semiconductor element package.

According to the first embodiment, the substrate 110 and the housing 130 are manufactured in a wafer level package process, and the diffusion part 140 may be attached onto the housing 130 in a separated process.

According to the first embodiment, the diffusion part 140 may be stably fixed to the housing 130 by an adhesive layer provided between the diffusion part 140 and the recessed region 142 of the housing 130.

According to the first embodiment, since third to sixth connecting members and the third to sixth bonding portions 147, 149, 177 and 179 configuring the sensing unit are disposed inside the semiconductor element package 100, it is possible to accurately detect the deviation of the diffusion part 140 without being affected by the external environment.

According to the first embodiment, since the third to sixth connecting members and the third to sixth bonding portions 147, 149, 177 and 179 configuring a sensing unit are disposed inside the semiconductor element package 100, it is possible to block the possibility of an error in detecting the deviation of the diffusion part 140 due to damage of the sensing unit by external impact.

Exemplary Embodiment 2

Figure 6:
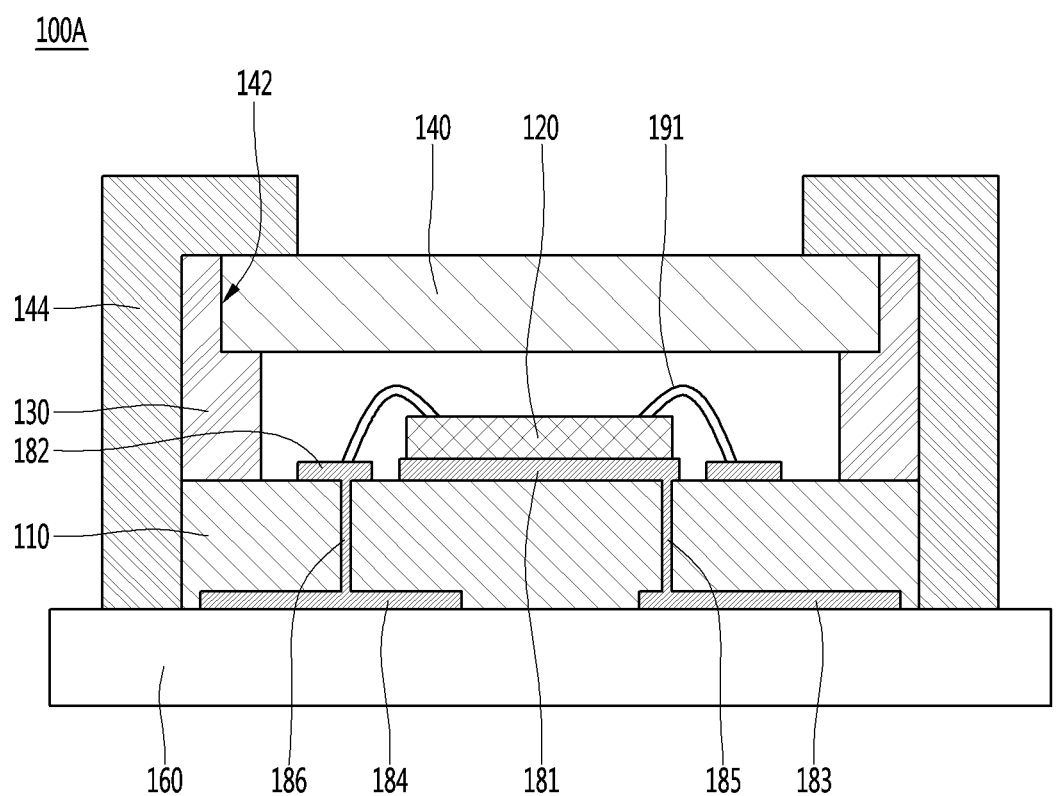
FIG. 6 is a cross-sectional view illustrating a semiconductor element package according to a second embodiment.
Figure 7:
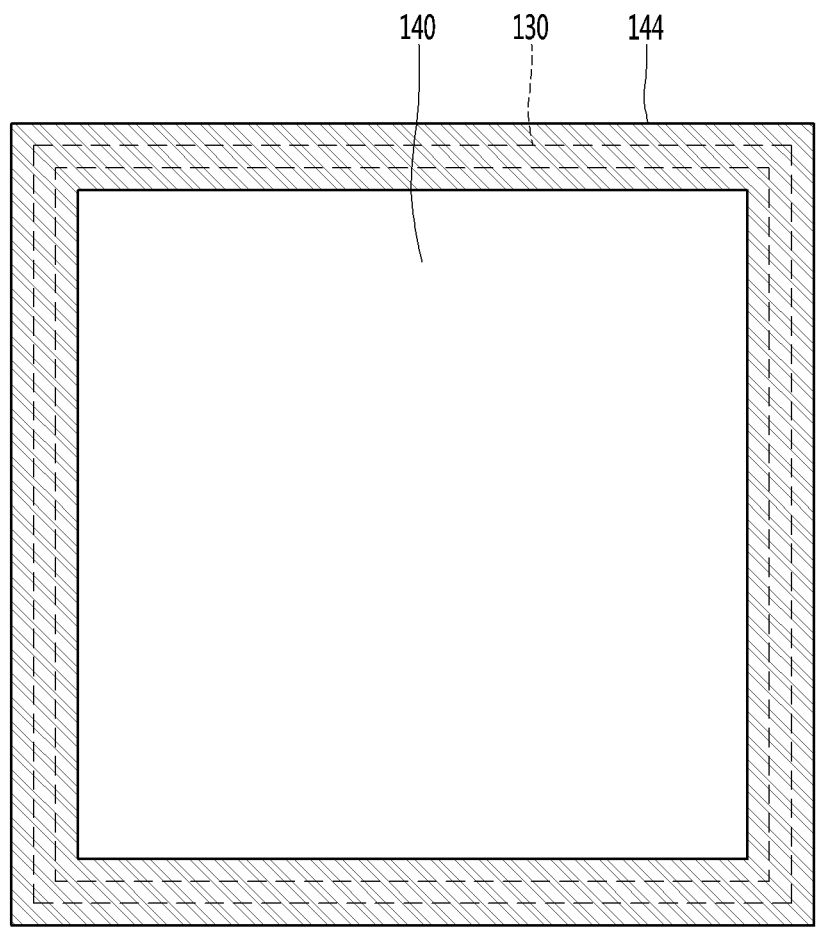
FIG. 7 is a plan view illustrating the semiconductor element package according to a third embodiment.

Referring to FIGS. 6 and 7, a semiconductor element package according to an embodiment will be described. FIG. 6 is a cross-sectional view illustrating a semiconductor element package according to a first embodiment, and FIG. 7 is a plan view illustrating the semiconductor element package according to the first embodiment.

The second embodiment, unlike the first embodiment, presents a structure in which a diffusion part 140 is fixed by a protective layer 144 so that the diffusion part 140 is not deviated. In the second embodiment, the same reference numerals are designated to elements having the same shapes and functions as those of the first embodiment, and detailed description thereof will be omitted.

A semiconductor element package 100A according to the second embodiment may include a substrate 110 and a semiconductor element 120 disposed on the substrate 110.

The semiconductor element package 100A according to the second embodiment may further include a housing 130 surrounding the semiconductor element 120 and disposed at an edge of the substrate 110.

The semiconductor element package 100A according to the second embodiment may further include the diffusion part 140 that is seated in a recessed region 142 of the housing 130.

The semiconductor element package 100A according to the second embodiment may further include a first electrode 181 and a second electrode 182 disposed on an upper surface of the substrate 110. The semiconductor element 120 is disposed on the first electrode 181 and may be electrically connected to the first electrode 181. One region of the semiconductor element 120 may be electrically connected to the second electrode 182 using a wire 191.

The semiconductor element package 100A according to the second embodiment is electrically connected to the first electrode 181 and the second electrode 182 using a first connection wiring 185 and a second connection wiring 186 and may further include a first bonding portion 183 and a second bonding portion 184 disposed on a lower surface of the substrate 110. The first connection wiring 185 and the second connection wiring 186 may be disposed in first and second via holes passing through the substrate 110, respectively.

The semiconductor element package 100A according to the second embodiment may further include a circuit board 160 including at least one signal line. The first bonding portion 183 and the second bonding portion 184 may be electrically connected to a first signal line and a second signal line of the circuit board 160.

The semiconductor element package 100A according to the second embodiment may further include a protective layer 144. The protective layer 144 may fix the housing 130 and the diffusion part 140. The protective layer 144 may prevent external oxygen or moisture from being penetrated into the housing 130. The protective layer 144 may protect the housing 130, the diffusion part 140, and further the semiconductor element 120 from the outside.

The protective layer 144 may include a resin-based insulating material. Specifically, the protective layer 144 may include a silicone resin, an epoxy resin, a thermosetting resin including a plastic material, or a high heat-resistant material.

The protective layer 144 may include an inorganic material. Specifically, the protective layer 144 may be provided as at least one material selected from the group consisting of, for example. $SiO_2$, $Si_3N_4$, $Al_2O_3$, and $TiO_2$.

The protective layer 144 may include a conductive material. The protective layer 144 may be provided with a conductive material, for example, a metal material. Specifically, the protective layer 144 may be provided as a single material selected from the group consisting of Ti, Ru, Rh, Ir, Mg, Zn, Al, In, Ta, Pd, Co, Ni, Si, Ge, Ag, and Au, or an alloy thereof.

When the protective layer 144 is formed of a conductive material, the protective layer 144 may be fixed to the circuit board 160 using a conductive solder paste. When the protective layer 144 is formed of a resin-based insulating material, the protective layer 144 may be directly fixed to the circuit board 160.

The protective layer 144 may be disposed around an outer surface of the substrate 110. The protective layer 144 may be disposed around an outer surface of the housing 130. The protective layer 144 may be disposed on an upper surface of the housing 130. The protective layer 144 may be disposed along an edge of the diffusion part 140.

For example, the protective layer 144 may include a first region disposed along the edge of the diffusion part 140 and a second region extending from the first region and contacting the circuit board 160 via the outer surface of the housing 130.

In order to enhance fixation, an adhesive layer may be provided at the outer surface of the substrate 110 in contact with the protective layer 144, the outer surface of the housing 130, the upper surface of the housing 130, and a partial region of the edge of the diffusion part 140.

One side of the protective layer 144 may be in contact with the circuit board 160 and the other side of the protective layer 144 may be in contact with the partial region of the edge of the diffusion part 140.

As shown in FIG. 7, the protective layer 144 may have a closed-loop shape when viewed from top thereof. That is, the protective layer 144 may be disposed along a periphery of the outer surface of the substrate 110, a periphery of the outer surface of the housing 130, and a periphery of the edge of the diffusion part 140.

The protective layer 144 may be referred to as a capping layer.

According to the second embodiment, since the diffusion part 140 seated on the housing 130 is fixed by the protective layer 144, strong light emitted from the semiconductor element 120 due to deviation of the diffusion part 140 is not directly irradiated to a human eye, thereby improving product reliability.

According to the second embodiment, since the diffusion part 140 seated on the housing 130 is fixed by the protective layer 144, mechanical stability is excellent and the semiconductor element 120 may be safely protected from external impact.

According to the second embodiment, since the housing 130 is surrounded by the protective layer 144, external oxygen or moisture may be prevented from penetrating into the semiconductor element 120.

Exemplary Embodiment 3

Figure 8:
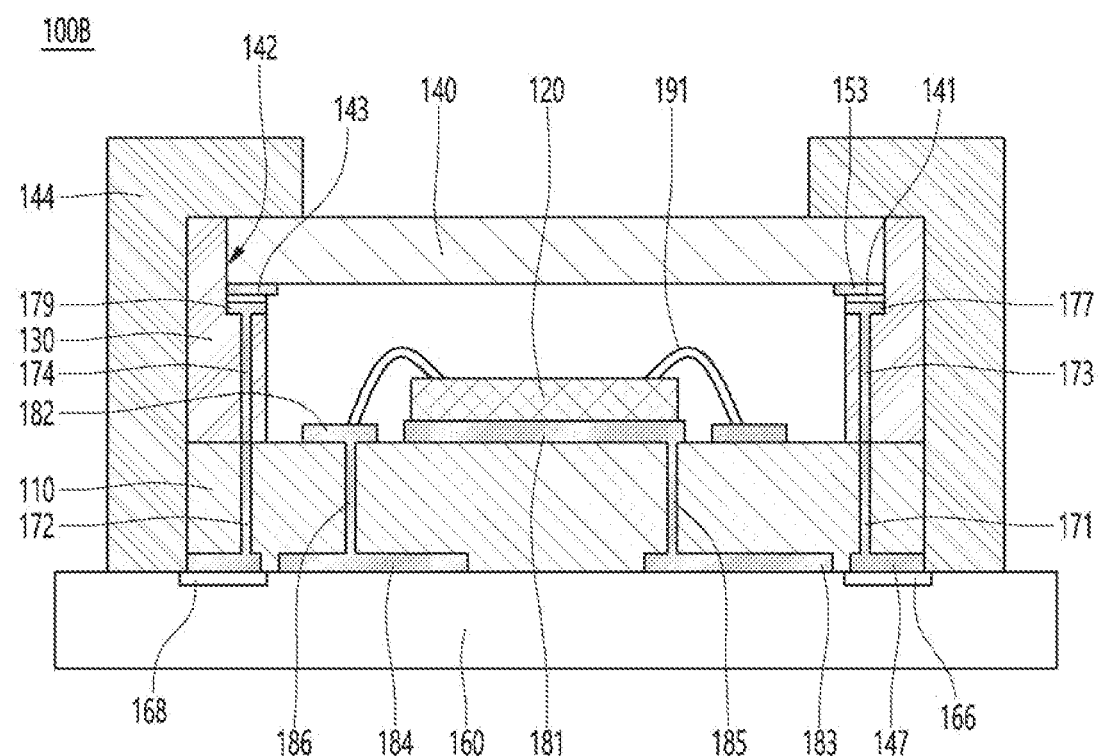
FIG. 8 is a cross-sectional view illustrating the semiconductor element package according to the third embodiment.

FIG. 8 is a cross-sectional view illustrating the semiconductor element package according to the third embodiment.

The third embodiment presents a structure in which the sensing part of the first embodiment and the protective layer 144 of the second embodiment are combined. Therefore, in the third embodiment, the same reference numerals are designated to elements having the same shapes and functions as those of the first and second embodiments, and a detailed description thereof will be omitted.

A semiconductor element package 100B according to the third embodiment may include a substrate 110, a semiconductor element 120, first and second electrodes 181 and 182, first and second connection wirings 185 and 186, first and second bonding portions 183 and 184, a substrate 110, a housing 130, and a diffusion part 140.

The semiconductor element package 100B according to the third embodiment may further include a sensing part for sensing deviation of the diffusion unit 140. The sensing part may include third to sixth bonding portions 147, 149, 177, and 179 and third to sixth connection portions.

The semiconductor element package 100B according to the third embodiment may further include a protective layer 144. The protective layer 144 may fix the housing 130 and the diffusion part 140. The protective layer 144 may prevent external oxygen or moisture from being penetrated into the housing 130. The protective layer 144 may protect the housing 130, the diffusion part 140, and further the semiconductor element 120 from the outside.

The protective layer 144 may include a resin-based insulating material. Specifically, the protective layer 144 may include a silicone resin, an epoxy resin, a thermosetting resin including a plastic material, or a high heat-resistant material.

The protective layer 144 may include an inorganic material. Specifically, the protective layer 144 may be provided as at least one material selected from the group consisting of, for example. $SiO_2$, $Si_3N_4$, $Al_2O_3$, and $TiO_2$.

The protective layer 144 may include a conductive material. The protective layer 144 may be provided with a conductive material, for example, a metal material. Specifically, the protective layer 144 may be provided as a single material selected from the group consisting of Ti, Ru, Rh, Ir, Mg, Zn, Al, In, Ta, Pd, Co, Ni, Si, Ge, Ag, and Au, or an alloy thereof.

When the protective layer 144 is formed of a conductive material, the protective layer 144 may be fixed to the circuit board 160 using a conductive solder paste. When the protective layer 144 is formed of a resin-based insulating material, the protective layer 144 may be directly fixed to the circuit board 160.

The protective layer 144 may be disposed around an outer surface of the substrate 110. The protective layer 144 may be disposed around an outer surface of the housing 130. The protective layer 144 may be disposed on an upper surface of the housing 130. The protective layer 144 may be disposed along an edge of the diffusion part 140.

In order to enhance fixation, an adhesive layer may be provided at the outer surface of the substrate 110 in contact with the protective layer 144, the outer surface of the housing 130, the upper surface of the housing 130, and a partial region of the edge of the diffusion part 140.

One side of the protective layer 144 may be in contact with the circuit board 160 and the other side of the protective layer 144 may be in contact with the partial region of the edge of the diffusion part 140.

The protective layer 144 may have a closed-loop shape when viewed from above (see FIG. 7).

Exemplary Embodiment 4

Figure 9:
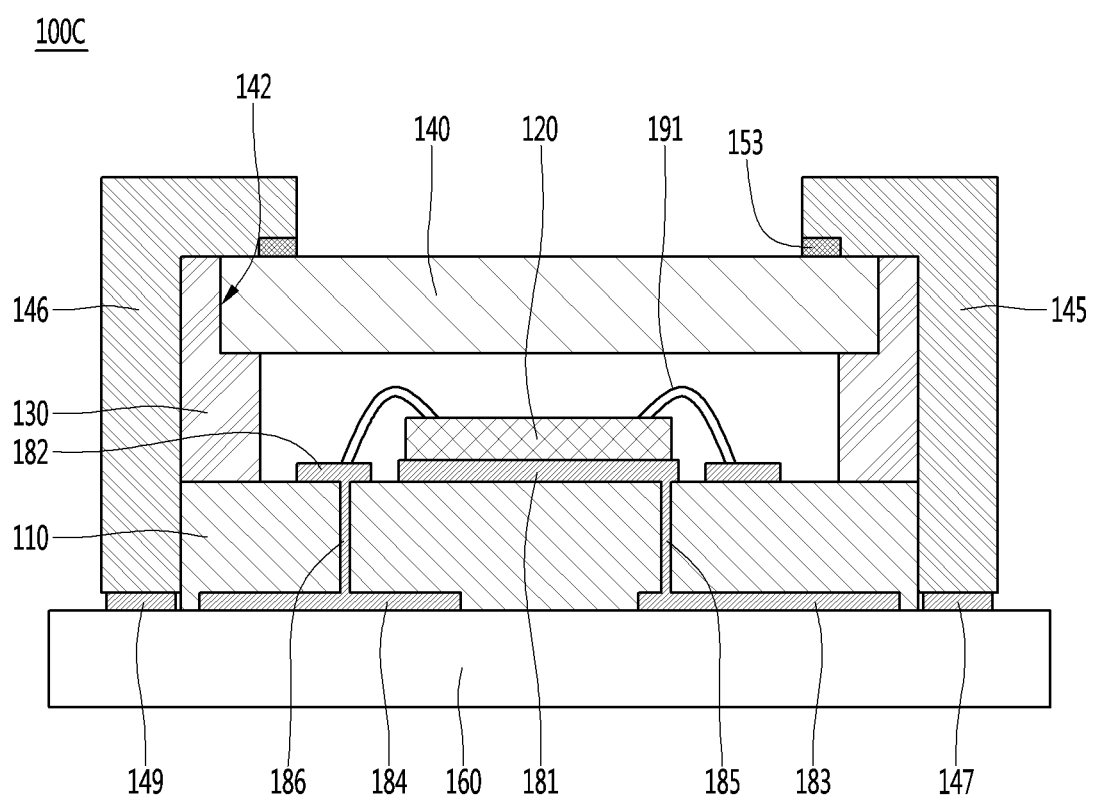
FIG. 9 is a cross-sectional view illustrating a semiconductor element package according to a fourth third embodiment.
Figure 10:
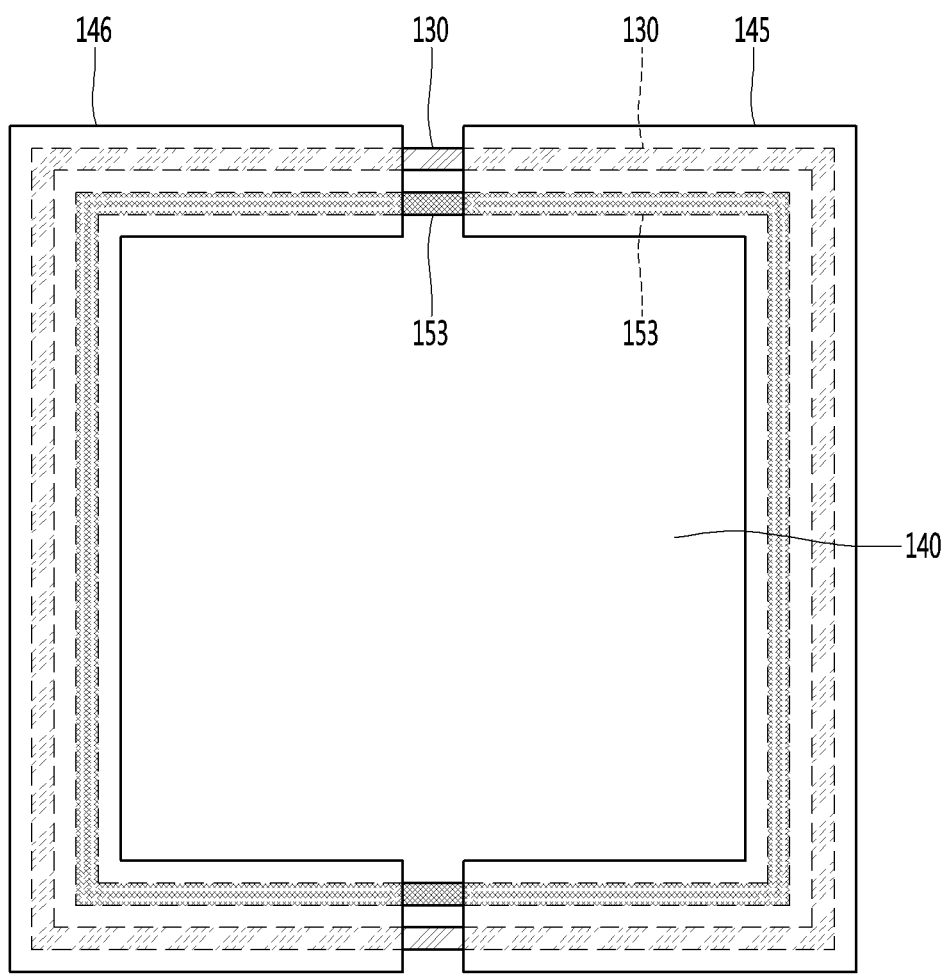
FIG. 10 is a plan view illustrating the semiconductor element package according to the fourth embodiment.

Referring to FIGS. 9 and 10, a semiconductor element package according to an embodiment will be described. FIG. 9 is a cross-sectional view illustrating a semiconductor element package according to a fourth third embodiment, and FIG. 10 is a plan view illustrating the semiconductor element package according to the fourth embodiment.

The fourth embodiment presents a structure in which the protective layer 144 of the second embodiment is divided into first and second protective layers 145 and 146 and formed of a conductive material to constitute a sensing part. In the fourth embodiment, the same reference numerals are designated to elements having the same shapes and functions as those of the second embodiment, and detailed description thereof will be omitted.

A semiconductor element package 100C according to the fourth embodiment may include a substrate 110 and a semiconductor element 120 disposed on the substrate 110.

The semiconductor element package 100C according to the fourth embodiment may further include a housing 130 surrounding the semiconductor element 120 and disposed at an edge of the substrate 110

The semiconductor element package 100C according to the fourth embodiment may further include a diffusion part 140 that is seated in a recessed region 142 of the housing 130.

The semiconductor element package 100C according to the fourth embodiment may further include a first electrode 181 and a second electrode 182 disposed on an upper surface of the substrate 110. The semiconductor element 120 is disposed on the first electrode 181 and may be electrically connected to the first electrode 181. One region of the semiconductor element 120 may be electrically connected to the second electrode 182 using a wire 191.

The semiconductor element package 100C according to the fourth embodiment is electrically connected to the first electrode 181 and the second electrode 182 using a first connection wiring 185 and a second connection wiring 186 and may further include a first bonding portion 183 and a second bonding portion 184 disposed on a lower surface of the substrate 110. The first connection wiring 185 and the second connection wiring 186 may be disposed in first and second via holes passing through the substrate 110, respectively.

The semiconductor element package 100C according to the fourth embodiment may further include a circuit board 160 including at least one signal line. The first bonding portion 183 and the second bonding portion 184 may be electrically connected to a first signal line and a second signal line of the circuit board 160.

The semiconductor element package 100C according to the fourth embodiment may further include protective layers 145 and 146. The protective layers 145 and 146 may fix the housing 130 and the diffusion part 140. The protective layers 145 and 146 may prevent external oxygen or moisture from being penetrated into the housing 130. The protective layers 145 and 146 may protect the housing 130, the diffusion part 140, and further the semiconductor element 120 from the outside.

In particular, the protective layers 145 and 146 may include a conductive material. The protective layers 145 and 146 may be provided with a conductive material, for example, a metal material. Specifically, the protective layers 145 and 146 may be provided as a single material selected from the group consisting of Ti, Ru, Rh, Ir, Mg, Zn, Al, In, Ta, Pd, Co, Ni, Si, Ge, Ag, and Au, or an alloy thereof. Thus, the protective layers 145 and 146 may be referred to as conductive layers.

The protective layers 145 and 146 may be disposed around an outer surface of the substrate 110. The protective layers 145 and 146 may be disposed around an outer surface of the housing 130. The protective layers 145 and 146 may be disposed on an upper surface of the housing 130. The protective layers 145 and 146 may be disposed along an edge of the diffusion part 140.

The protective layer may include a first protective layer 145 and a second protective layer 146. The first protective layer 145 and the second protective layer 146 may be spaced apart from each other.

As shown in FIG. 10, the first protective layer 145 may be disposed around a first outer side surface of the substrate 110, around a first outer side surface of the housing 130, on an upper surface of one side of the housing 130, and in a partial region of a first end of the diffusion part 140. The second protective layer 146 may be disposed around a second outer side surface of the substrate 110, around a second outer side surface of the housing 130, on an upper surface of the other side of the housing 130, and in a partial region of a second end of the diffusion part 140.

A periphery of the first outer side surface of the substrate 110 and a periphery of the second outer side surface of the substrate 110 may face each other and may be symmetrical to each other. A periphery of the first outer side surface of the housing 130 and a periphery of the second outer side surface of the housing 130 may face each other and may be symmetrical to each other. The upper surface of the one side of the housing 130 and the upper surface of the other side of the housing 130 may face each other and may be symmetrical to each other. The partial region of the first end of the diffusion part 140 and the partial region of the second end of the diffusion part 140 may face each other and may be symmetrical to each other.

The first protective layer 145 and the second protective layer 146 may be disposed to be spaced apart from each other such that an electrical short circuit does not occur. For example, a distance between the first protective layer 145 and the second protective layer 146 may be 50 nm to 200 nm. The electrical short circuit is prevented at a distance of 50 nm or more between the first protective layer 145 and the second protective layer 146. When the distance between the first protective layer 145 and the second protective layer 146 is 200 nm or less, the housing 130 or the diffusion part 140 may be surrounded as much as possible.

The semiconductor element package 100C according to the fourth embodiment may further include a pad 153 disposed on the diffusion part 140.

The pad 153 may include a conductive material. i.e., a metal material. The pad 153 may be electrically connected to the first protective layer 145 and may be electrically connected to the second protective layer 146.

The pads 153 may be provided in a single layer or in multiple layers. As an example, the pad 153 may include at least one material selected from the group consisting of Cr. Ni, Au, Ti, and Pt, or an alloy thereof. In addition, the pad 153 may be provided as Cr/Ni/Au, Ti/Pt/Au, or Ti/Au, as an example.

An adhesive layer (not shown) may be disposed on the pad 153. The adhesive layer may electrically connect the first and second protective layers 145 and 146 to the pad 153 using a metal bonding method. That is, the first protective layer 145 may be electrically connected to one side region of the pad 153 via the adhesive layer, and the second protective layer 146 may be electrically connected to the other side region of the pad 153 via the adhesive layer.

The adhesive layer may be provided as at least one material selected from the group consisting of Ag, Au, and AuSn.

The pad 153 may be disposed along the periphery of an upper surface of the diffusion part 140. The pad 153 may have a closed-loop shape. Therefore, the first protective layer 145 may be electrically connected to a partial region of the pad 153 and the second protective layer 146 may be electrically connected to another partial region of the pad 153.

The semiconductor element package 100C according to the fourth embodiment may further include bonding portions 147 and 149 disposed on lower surfaces of the first protective layer 145 and the second protective layer 146, respectively.

The bonding portion may be referred to as a third bonding portion 147 and a fourth bonding portion 149 in order to distinguish the first bonding portion 183 and the second bonding portion 184 described above.

The third bonding portion 147 and the fourth bonding portion 149 may be collectively formed by the same bonding process as the first bonding portion 183 and the second bonding portion 184, but the present invention is not limited thereto. In this case, the first to fourth bonding portions 183, 184, 147, and 149 may include the same metal material, but the present invention is not limited thereto.

The third bonding portion 147 may be electrically connected to a third signal line 165 of the circuit board 160 and the fourth bonding portion 149 may be electrically connected to a fourth signal line 167 of the circuit board 160.

First and second protective parts may be referred to as a sensing part for sensing deviation of the diffusion part 140. Alternatively, the first and second protective parts and the pad 153 may be referred to as the sensing part for sensing the deviation of the diffusion part 140. Alternatively, the first and second protective parts, the pad 153, and the third and fourth bonding portions 147 and 149 may be referred to as the sensing part for sensing the deviation of the diffusion part 140.

The circuit board 160 may include a detection circuit (see FIG. 6) that may detect whether or not the diffusion part 140 is separated from the housing 130. The detection circuit may include a region P disposed between the third signal line 165 of the circuit board 160 and the fourth signal line 167 of the circuit board 160 as shown in FIG. 5.

A third resistor R3 disposed between the third signal line 165 of the circuit board 160 and the fourth signal line 167 of the circuit board 160 in the region P may be a resistance value present in the third signal line 165 of the circuit board 160—the third bonding portion 147—the first protective layer 145—the pad 153—the second protective layer 146—the fourth bonding portion 149—the fourth signal line 167 of the circuit board 160 described with reference to FIG. 9.

As an example, when the diffusion part 140 is normally fixed on the housing 130, since the third signal line 165 of the circuit board 160—the third bonding portion 147—the first protective layer 145—the pad 153—the second protective layer 146—the fourth bonding portion 149—the fourth signal line 167 of the circuit board 160 is electrically connected to each other, the resistance value of the third resistor R3 may be zero or may have a resistance value close to zero.

As an example, when the diffusion part 140 is separated and deviated on the housing 130, since the third signal line 165 of the circuit board 160—the third bonding portion 147—the first protective layer 145—the pad 153—the second protective layer 146—the fourth bonding portion 149—the fourth signal line 167 of the circuit board 160 is electrically short-circuited and opened, the value of the third resistor R3 may have a large resistance value. As an example, the third resistor R3 may be measured to have an infinite resistance value or a resistance value of several mega ohms to several tens of mega ohms.

<When Diffusion Part 140 is Normally Fixed on Housing 130>

In this case, since the diffusion part 140 is normally connected on the housing 130, the first protective layer 145 and the pad 153 or the second protective layer 146 and the pad 153 may be normally connected. Accordingly, since the third signal line 165 of the circuit board 160—the third bonding portion 147—the first protective layer 145—the pad 153—the second protective layer 146—the fourth bonding portion 149—the fourth signal line 167 of the circuit board 160 is electrically connected, the resistance value of the third resistor R3 may have a value close to zero.

That is, since the resistance value of the third resistor R3 in the detection circuit shown in FIG. 5 will have an approximation of zero, the first node N1 will have an approximation of 0 V. As an example, when a voltage of 5 V is applied to the second power supply unit 320, the third resistor R3 has 0.0001 ohms, and the first resistor R1 has 5000 ohms, it is possible to have an approximation of 0 V at the first node N1.

In addition, when a voltage of 2 V is applied to the first power supply unit 310, 2 V may be supplied to the first input terminal 301 and 0 V may be supplied to the second input terminal 302. Accordingly, since the first voltage value input to the first input terminal 301 is larger than the second voltage value input to the second input terminal 302, a "Low" signal indicating "normal" may be supplied to the output terminal 303.

Meanwhile, the circuit board 160 may include a control unit (not shown) that receives a signal output from the comparison unit 300 and controls driving of the semiconductor element 120. The control unit may be included in the detection circuit, but the control unit is not limited thereto. The control unit may be connected to the output terminal 303. Therefore, the control unit may receive a logic value of the detection circuit from the output terminal 303 of the comparison unit 300. That is, when the control unit receives a "Low" signal indicating "normal" from the output terminal 303, the control unit may control to normally supply driving power supplied to the semiconductor element 120.

As an example, the circuit board 160 may include a first signal line electrically connected to the first bonding portion 183 and a second signal line electrically connected to the second bonding portion 184. The circuit board 160 may continuously supply a driving voltage to the semiconductor element 120 through the third signal line 165 and the fourth signal line 167 by the control of the control unit.

<When Diffusion Part 140 is Separated and Deviated from Housing 130>

In this case, since the diffusion part 140 is deviated from the housing 130, a space between the first protective layer 145 and the pad 153 or between the second protective layer 145 and the pad 153 may be electrically short-circuited. Accordingly, since the third signal line 165 of the circuit board 160—the third bonding portion 147—the first protective layer 145—the pad 153—the second protective layer 146—the fourth bonding portion 163—the fourth signal line 167 of the circuit board 160 is electrically opened, the resistance value of the third resistor R3 will have a large value close to infinity.

That is, since the resistance value of the third resistor R3 has a large value close to infinity in the detection circuit shown in FIG. 5, the first node N1 will have a value corresponding to a voltage applied to the second power supply unit 320. As an example, when a voltage of 5 V is applied to the second power supply unit 320, the third resistor R3 has 10 mega ohms, and the first resistor R1 has 5000 ohms, it is possible to have an approximate value of 5 V at the first node N1.

In addition, when a voltage of 2 V is applied to the first power supply unit 310, 2 V may be supplied to the first input terminal 301 and 5 V may be supplied to the second input terminal 302. Accordingly, since the first voltage value input to the first input terminal 301 is smaller than the second voltage value input to the second input terminal 302, a "High" signal indicating "abnormal" may be supplied to the output terminal 303.

Meanwhile, when the control unit receives a "High" signal indicating "abnormal" from the output terminal 303, the control unit may control to shut off the driving power supplied to the semiconductor element 120.

As an example, the circuit board 160 may include the first signal line electrically connected to the first bonding portion 183 and the second signal line electrically connected to the second bonding portion 184. The circuit board 160 may shut off the driving voltage supplied to the semiconductor element 120 through the first signal line and the second signal line by the control of the control unit. Accordingly, the semiconductor element 120 no longer emits a beam.

Therefore, according to the semiconductor element package 100C according to the first embodiment, it is possible to detect that the diffusion part 140 is separated from the housing 130 and to control the semiconductor element 120 not to be driven.

As described above, according to the fourth embodiment, when it is detected whether the diffusion part 140 is separated or not by using an electrical signal, and that the diffusion part 140 is deviated, the driving voltage applied to the semiconductor element 120 may be shut off. Accordingly, in the semiconductor element package 100C according to the fourth embodiment, since it may be detected in real time that the diffusion part 140 is deviated from the housing 130, and the driving voltage applied to the semiconductor element 120 may be controlled in real time, it is possible to fundamentally prevent the strong light emitted from the semiconductor element 120 from being directly irradiated to a person.

Exemplary Embodiment 5

Figure 11:
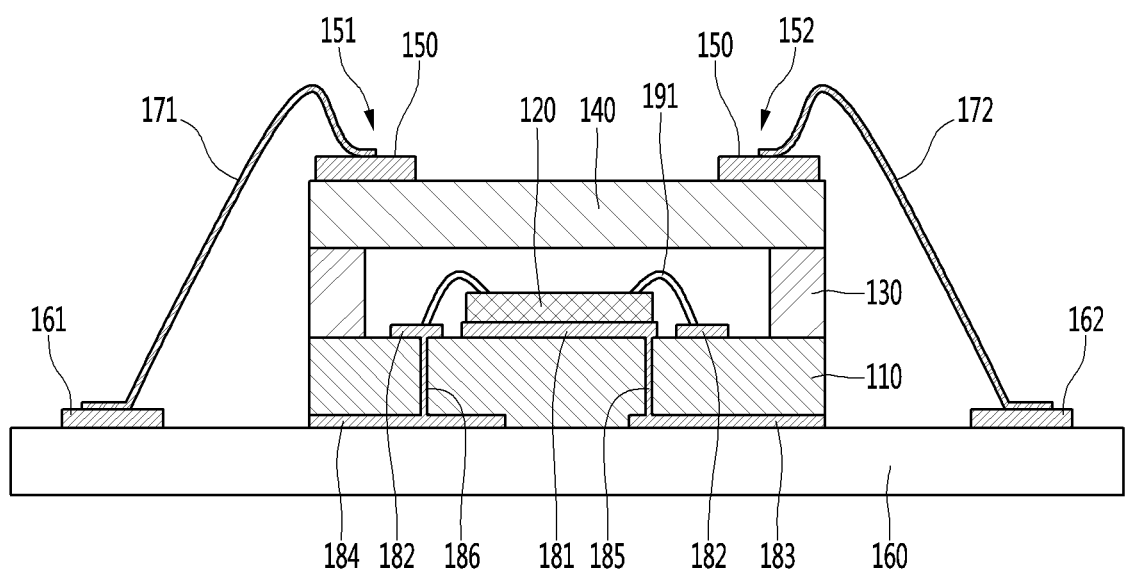
FIG. 11 is a cross-sectional view illustrating a semiconductor element package according to a fifth embodiment.
Figure 12:
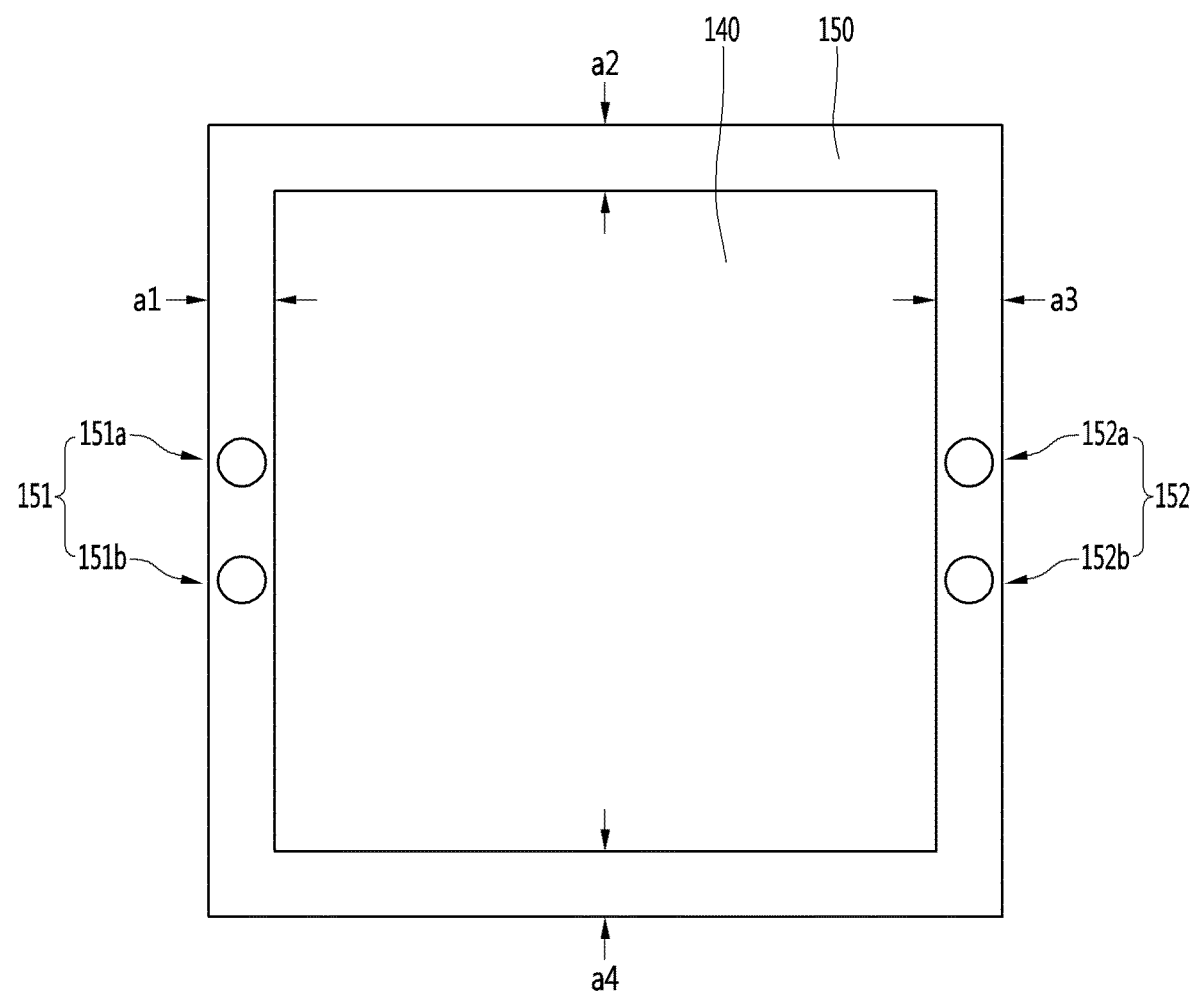
FIG. 12 is a first exemplary view illustrating a shape of an electrode pad.
Figure 13:
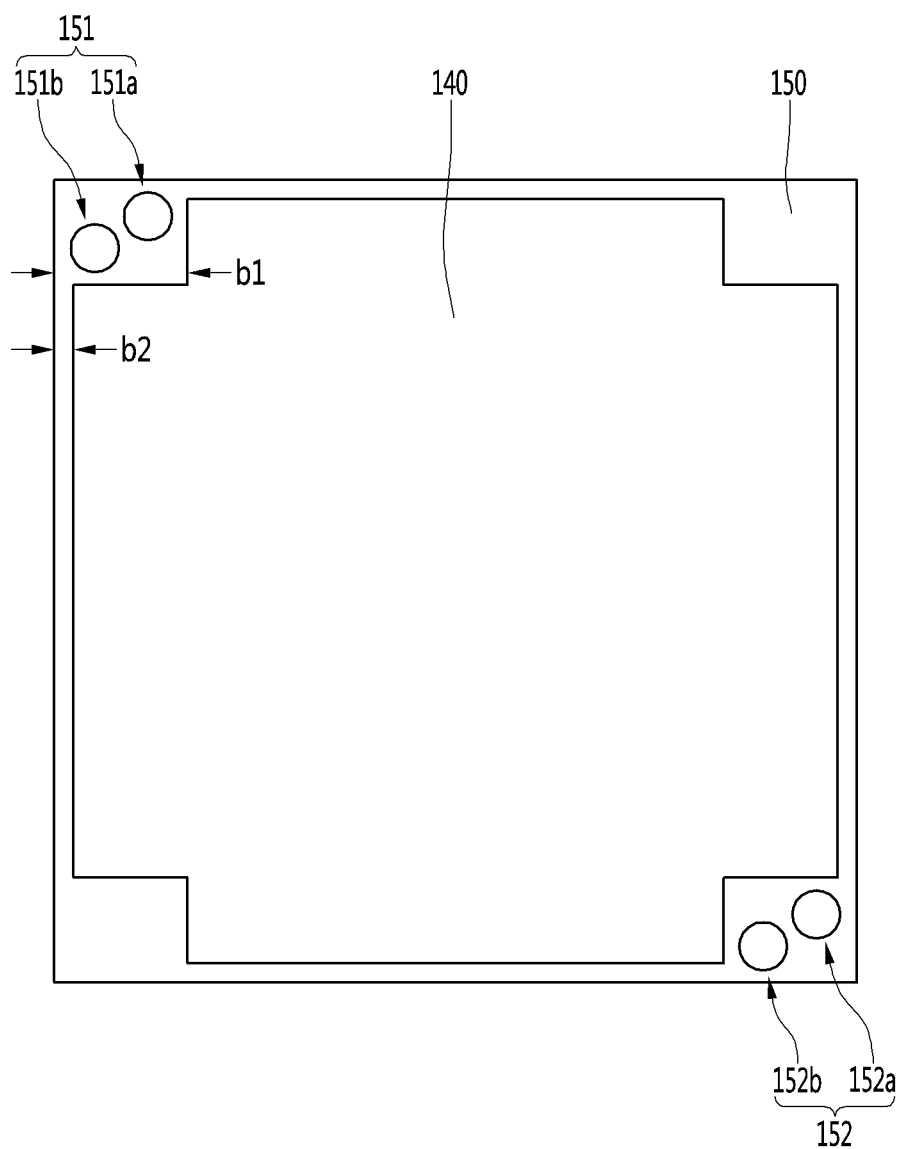
FIG. 13 is a second exemplary view illustrating a shape of an electrode pad.
Figure 14:
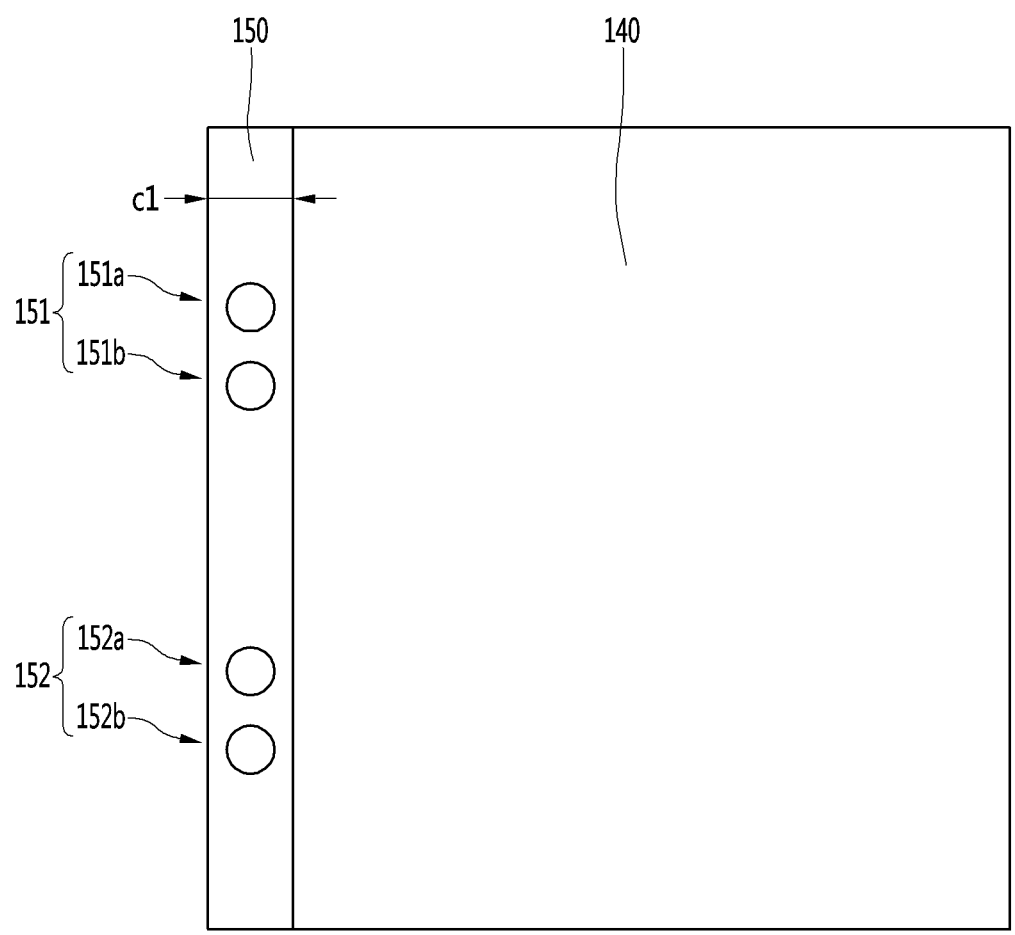
FIG. 14 is a third exemplary view illustrating a shape of an electrode pad.

FIG. 11 is a cross-sectional view illustrating a semiconductor element package according to a fifth embodiment. FIG. 12 is a first exemplary view illustrating a shape of an electrode pad. FIG. 13 is a second exemplary view illustrating a shape of an electrode pad, and FIG. 14 is a third exemplary view illustrating a shape of an electrode pad.

Referring to FIG. 11, a description of the semiconductor element package according to the fifth embodiment, which is redundant with the contents described with reference to FIGS. 1 to 10 may be omitted.

Referring to FIGS. 1I and 12, a semiconductor device package 100D according to the fifth embodiment may include a substrate 110 and a semiconductor device 120 disposed on the substrate 110.

The substrate 110 may include a material having a high thermal conductivity. The substrate 110 may be provided with a material having excellent heat dissipation characteristics so as to efficiently discharge heat generated in the semiconductor element 120 to the outside thereof. The substrate 110 may include an insulating material.

For example, the substrate 110 may include a ceramic material. The substrate 110 may include a low temperature co-fired ceramic (LTCC) or a high temperature co-fired ceramic (HTCC) that is co-fired.

In addition, the substrate 110 may include a metal compound. The substrate 110 may include a metal oxide having a thermal conductivity of 140 W/mK or more. For example, the substrate 110 may include aluminum nitride (AlN) or alumina ($Al_2O_3$).

As another example, the substrate 110 may include a resin-based insulating material. The substrate 110 may be provided with a silicone resin, an epoxy resin, a thermosetting resin including a plastic material, or a high heat-resistant material.

Meanwhile, as another example, the substrate 110 may include a conductive material. When the substrate 110 is provided with a conductive material, for example, a metal, an insulating layer may be provided for electrical insulation between the substrate 110 and the semiconductor element 120.

The semiconductor element 120 according to the fifth embodiment may be selected from a light emitting device including a light emitting diode device and a laser diode device. As an example, the semiconductor element 120 may be a vertical cavity surface emitting laser (VCSEL) semiconductor element. The VCSEL semiconductor element may emit beams in a direction perpendicular to a top surface thereof. The VCSEL semiconductor element may emit beams upward in a beam angle of, for example, about 15 to 25 degrees. The VCSEL semiconductor element may include a single light emitting aperture or multiple light emitting apertures that emit a circular beam. An example of the VCSEL semiconductor element will be described later.

The semiconductor element package 100 according to the fifth embodiment may further include a housing 130. The housing 130 may be disposed on the substrate 110. The housing 130 may be disposed around the semiconductor element 120.

The housing 130 may include a material having a high thermal conductivity. The housing 130 may be provided with a material having excellent heat dissipation characteristics so as to efficiently discharge heat generated in the semiconductor element 120 to the outside thereof. The housing 130 may include an insulating material.

For example, the housing 130 may include a ceramic material. The housing 130 may include a low temperature co-fired ceramic (LTCC) or a high temperature co-fired ceramic (HTCC) that is co-fired.

In addition, the housing 130 may include a metal compound. The housing 130 may include a metal oxide having a thermal conductivity of 140 W/mK or more. For example, the housing 130 may include aluminum nitride (AlN) or alumina ($Al_2O_3$).

As another example, the housing 130 may include a resin-based insulating material. The housing 130 may be provided with a silicone resin, an epoxy resin, a thermosetting resin including a plastic material, or a high heat-resistant material.

Meanwhile, as another example, the housing 130 may include a conductive material. The housing 130 may be provided with a conductive material, for example, a metal.

As an example, the housing 130 may include the same material as that of the substrate 110. When the housing 130 is formed of the same material as that of the substrate 110, the housing 130 may be formed integrally with the substrate 110.

In addition, the housing 130 may be formed of a material different from that of the substrate 110.

According to the semiconductor element package 100D according to the fifth embodiment, the substrate 110 and the housing 130 may be provided with a material having excellent heat dissipation characteristics. Accordingly, heat generated in the semiconductor element 120 may be effectively discharged to the outside thereof.

According to the fifth embodiment, when the substrate 110 and the housing 130 are provided and coupled as separate parts, an adhesive layer may be provided between the substrate 110 and the housing 130.

As an example, the adhesive layer may include an organic material. The adhesive layer may include an epoxy-based resin. In addition, the adhesive layer may include a silicone-based resin.

The semiconductor element package including a substrate 110 and a housing 130 may be manufactured, for example, by a wafer level package process. That is, the semiconductor element 120 and the housing 130 are attached onto the substrate 110 at a wafer level, and a plurality of semiconductor element packages in which the semiconductor element 120 and the housing 130 are coupled to the substrate 110 by a cutting method such as dicing or the like may be provided.

As described above, when the semiconductor element package 100D including the substrate 110 and the housing 130 is manufactured by a wafer level package process, an outer surface of the substrate 110 and an outer surface of the housing 130 may be formed in the same plane. That is, there is no a step between the outer surface of the substrate 110 and the outer surface of the housing 130.

According to the fifth embodiment, since there is no step between the outer surface of the substrate 110 and the outer surface of the housing 130, it is possible to fundamentally prevent a failure caused by moisture permeation due to a step structure and damage due to external friction and the like in a conventional semiconductor element package.

In addition, the semiconductor element package 100 according to the fifth embodiment may further include a first electrode 181 and a second electrode 182 disposed on the substrate 110. The first electrode 181 and the second electrode 182 may be disposed to be spaced apart from each other on the substrate 110.

As an example, the semiconductor element 120 may be disposed on the first electrode 181. The semiconductor element 120 may be provided on the first electrode 181 by, for example, a die bonding method.

The semiconductor element 120 may be electrically connected to the second electrode 182. As an example, the semiconductor element 120 and the second electrode 182 may be electrically connected by a connection wiring. The semiconductor element 120 may be electrically connected to the second electrode 182 by a plurality of connection wirings. The semiconductor element 120 may be electrically connected to the second electrode 182 by a first wire 191. In addition, the semiconductor element 120 may be electrically connected to the second electrode 182 by a second wire 191.

A number of wires connecting the semiconductor element 120 and the second electrode 182 and a connection position thereof may be selected by a size of the semiconductor element 120 or a degree of current diffusion required in the semiconductor element 120.

The semiconductor element package 100D according to the fifth embodiment may include a first bonding portion 183 and a second bonding portion 184 disposed under the substrate 110. For example, the first bonding portion 183 and the second bonding portion 184 may be electrically connected to a signal line (not shown) of a circuit board 160.

The first bonding portion 183 may be disposed on a lower surface of the substrate 110. The first bonding portion 183 may be electrically connected to the first electrode 181. The first bonding portion 183 may be electrically connected to the first electrode 181 through a first connection wiring 185. The first connection wiring 185 may be disposed, for example, in a first via hole provided in the substrate 110.

The second bonding portion 184 may be disposed on the lower surface of the substrate 110. The second bonding portion 184 may be electrically connected to the second electrode 182. The second bonding portion 184 may be electrically connected to the second electrode 182 through a second connection wiring 186. The second connection wiring 186 may be disposed, for example, in a second via hole provided in the substrate 110.

According to the fifth embodiment, driving power may be supplied to the semiconductor element 120 through the circuit board 160.

The semiconductor element package 100D according to the fifth embodiment described above has been described based on a case in which the semiconductor element 120 is connected to the first electrode 181 by a die bonding method and connected to the second electrode 182 by a wire bonding method.

However, a manner in which the driving power is supplied to the semiconductor element 120 may be variously modified and applied. For example, the semiconductor element 120 may be electrically connected to the first electrode 181 and the second electrode 182 by a flip chip bonding method. In addition, the semiconductor element 120 may be electrically connected to the first electrode 181 and the second electrode 182 by a wire bonding method.

In addition, the semiconductor element package 100D according to the fifth embodiment may include a diffusion part 140. The diffusion part 140 may be disposed on the semiconductor element 120. The diffusion part 140 may be disposed on the housing 130. The diffusion part 140 may be supported by the housing 130. The diffusion part 140 may be supported by a side wall of the housing 130. As an example, a lower surface of the diffusion part 140 may be supported by the side wall of the housing 130.

The diffusion part 140 may include a function configured to expand an angle of view of a beam of light emitted from the semiconductor element 120. The diffusion part 140 may include, for example, a microlens, a concavo-convex pattern, and the like.

The diffusion part 140 may set the angle of view of the beam depending on an application field of the semiconductor element package 100D. In addition, the diffusion part 140 may set intensity of light emitted depending on the application field of the semiconductor element package 100D.

In addition, the diffusion part 140 may include an anti-reflective function. For example, the diffusion part 140 may include an anti-reflective layer disposed on one surface facing the semiconductor element 120. The diffusion part 140 may include the anti-reflective layer disposed on a lower surface facing the semiconductor element 120. The anti-reflective layer prevents light incident from the semiconductor element 120 from being reflected from a surface of the diffusion part 140 and transmits the light into the diffusion part 140, thereby improving light loss due to reflection.

The anti-reflective layer may be formed of, for example, an anti-reflective coating film and attached to a surface of the diffusion part 140. In addition, the anti-reflective layer may be formed on the surface of the diffusion part 140 through spin coating, spray coating, or the like. As an example, the anti-reflective layer may be formed as a single layer or multiple layers including at least one of the group including $TiO_2$, $SiO_2$, $Al_2O_3$, $Ta_2O_3$, $ZrO_2$, and $MgF_2$.

The semiconductor element package 100D according to the fifth embodiment may include an adhesive layer provided between the diffusion part 140 and the housing 130. As an example, the adhesive layer may include an organic material. The adhesive layer may include an epoxy-based resin. In addition, the adhesive layer may include a silicone-based resin.

Meanwhile, as described above, the substrate 110 and the housing 130 may be manufactured by the wafer level package process. According to the fifth embodiment, the diffusion part 140 may also be attached onto the housing 130 by the wafer level package process.

That is, after the semiconductor element 120 and the housing 130 are attached onto the substrate 110 at the wafer level and the diffusion part 140 is attached onto the housing 130, a plurality of semiconductor element packages 100 in which the semiconductor element 120, the housing 130, and the diffusion part 140 are coupled to the substrate 110 by a cutting method such as dicing or the like may be provided.

As described above, when the semiconductor element package 100D including the substrate 110, the housing 130, and the diffusion part 140 is manufactured by the wafer level package process, the outer surface of the substrate 110, the outer surface of the housing 130, and the outer surface of the diffusion part 140 are formed in the same plane. That is, there is no step between the outer surface of the substrate 110, the outer surface of the housing 130, and the outer surface of the diffusion part 140.

According to the fifth embodiment, since there is no step between an outer surface of the substrate 110, an outer surface of the housing 130, and an outer surface of the diffusion part 140, it is possible to fundamentally prevent a defect that causes damage due to moisture permeation, external friction, and the like due to a step structure in the conventional semiconductor element package.

In addition, according to the fifth embodiment, the substrate 110 and the housing 130 are manufactured in a wafer level package process, and the diffusion part 140 may be attached onto the housing 130 in a separated process The semiconductor element package 100D according to the fifth embodiment may include an electrode pad 150.

The electrode pad 150 may be disposed on an upper surface of the diffusion part 140. As an example, the electrode pad 150 may be disposed around the upper surface of the diffusion part 140. The electrode pad 150 may be disposed in an outer region of the upper surface of the diffusion part 140.

The electrode pad 150 may include a first region 151 and a second region 152 that are disposed to be spaced apart from each other. The first region 151 and the second region 152 of the electrode pad 150 may be provided to be electrically connected to each other.

As an example, as shown in FIG. 12, the first region 151 and the second region 152 of the electrode pad 150 may be disposed on opposite sides of the upper surface of the diffusion part 140. The electrode pad 150 may be provided with a width of a1 on a first side, a width of a2 on a second side, a width of a3 on a third side, and a width of a4 on a fourth side with respect to the upper surface of the diffusion part 140.

At this time, the first side and the third side may be disposed to face each other with respect to the upper surface of the diffusion part 140. According to the fifth embodiment, the first region 151 of the electrode pad 150 may be disposed on the first side, and the second region 152 of the electrode pad 150 may be disposed on the third side.

As an example, the widths of a1, a2, a3 and a4 may be provided equal to each other. In addition, at least two widths selected from a1, a2, a3, and a4 may be provided differently. As an example, the widths of a1, a2, a3 and a4 may be provided by several hundred micrometers, respectively.

The widths of a1, a2, a3, and a4 may be selected to be large so that a connection resistance between the respective regions of the electrode pad 150 may be neglected. In addition, the widths of a1, a2, a3 and a4 may be selected to be small so as to have a value such that light provided from the semiconductor element 120 does not affect an angle of view of a beam provided to the outside.

In consideration of this point, the widths of a1, a2, a3, and a4 may be provided at 100 micrometers or more, as an example. Further, the widths of a1, a2, a3, and a4 may be provided at 600 micrometers or less, as an example.

In addition, according to the fifth embodiment, the widths of a1, a2, a3, and a4 may be selected to such a size that a first conductive wire 171 and a second conductive wire 172 may be bonded.

Meanwhile, in the fifth embodiment described with reference to FIG. 12, description has been made based on a case in which the first region 151 and the second region 152 of the electrode pad 150 are disposed on a side facing each other with respect to the upper surface of the diffusion part 140. However, according to another embodiment, a region in which a connection wiring is bonded in the electrode pad 150 may be disposed on at least two sides of four sides with respect to the upper surface of the diffusion part 140.

According to the fifth embodiment, the electrode pad 150 may be provided in a single layer or in multiple layers. As an example, the electrode pad 150 may include at least one material selected from the group consisting of Cr, Ni, Au, Ti, and Pt, or an alloy thereof. In addition, the electrode pad 150 may be provided as Cr/Ni/Au, Ti/Pt/Au, or Ti/Au, as an example.

Meanwhile, according to the semiconductor element package 100D according to the fifth embodiment, a disposition position of the electrode pad 150 disposed in the diffusion part 140 may be variously modified and selected.

As shown in FIG. 13, it is possible to include the electrode pad 150 disposed on the diffusion part 140.

The electrode pad 150 may be disposed on the upper surface of the diffusion part 140. As an example, the electrode pad 150 may be disposed around the upper surface of the diffusion part 140. The electrode pad 150 may be disposed in the outer region of the upper surface of the diffusion part 140.

The electrode pad 150 may include the first region 151 and the second region 152 that are disposed to be spaced apart from each other. The first region 151 and the second region 152 of the electrode pad 150 may be provided to be electrically connected to each other.

As an example, as shown in FIG. 13, the first region 151 and the second region 152 of the electrode pad 150 may be disposed in diagonal regions facing each other. The electrode pad 150 may include the first region 151 provided at a first corner with respect to the upper surface of the diffusion part 140. In addition, the electrode pad 150 may include the second region 152 provided at a third corner facing the first corner with respect to the upper surface of the diffusion part 140.

According to an embodiment, the first region 151 may be provided with a width of b1. In addition, the second region 152 may be provided based on a size of the first region 151.

Further, the pad 150 may be disposed at second and fourth corners disposed between the first corner in which the first region 151 is disposed and the third corner in which the second region 152 is disposed based on the size of the first region 151.

In addition, the electrode pad 150 disposed on sides connecting the respective edge regions may be provided with a width of b2. As an example, the width of b2 may be provided smaller than that of b1.

The widths of b1 and b2 may be selected to be large so that a resistance between the respective regions of the electrode pad 150 may be neglected. The widths of b1 and b2 may be selected to be small so as to have a value such that light provided from the semiconductor element 120 does not affect an angle of view of a beam provided to the outside.

In consideration of this point, b1 and b2 may be provided in a size of several hundred micrometers. As an example, b1 may be provided at 600 micrometers or less, and b2 may be provided at 100 micrometers or more.

In addition, according to an embodiment, the width of b1 may be selected to such a size that the first conductive wire 171 and the second conductive wire 172 may be bonded. In the first region 151 of the electrode pad 150, the connection wiring may be connected to a plurality of points 151a and 151b. Further, in the second region 152 of the electrode pad 150, the connection wiring may be connected to a plurality of points 152a and 152b.

According to an embodiment, the electrode pad 150 may be provided in a single layer or in multiple layers. As an example, the electrode pad 150 may include at least one material selected from the group consisting of Cr, Ni, Au. Ti, and Pt, or an alloy thereof. In addition, the electrode pad 150 may be provided as Cr/Ni/Au, Ti/Pt/Au, or Ti/Au, as an example.

Meanwhile, in the embodiment described with reference to FIG. 13, description has been made based on a case in which the first region 151 and the second region 152 of the electrode pad 150 are disposed on a diagonal corner facing each other with respect to the upper surface of the diffusion part 140. However, according to another embodiment, a region in which a connection wiring is bonded in the electrode pad 150 may be disposed on at least two corner regions of four corners with respect to the upper surface of the diffusion part 140.

In addition, according to the semiconductor element package 100D according to the fifth embodiment, a disposition position of the electrode pad 150 disposed in the diffusion part 140 may be modified and provided as shown in FIG. 14.

As shown in FIG. 14, it is possible to include an electrode pad 150 disposed on the diffusion part 140.

The electrode pad 150 may be disposed on the upper surface of the diffusion part 140. As an example, the electrode pad 150 may be disposed in the outer region of the upper surface of the diffusion part 140.

The electrode pad 150 may include the first region 151 and the second region 152 that are disposed to be spaced apart from each other. The first region 151 and the second region 152 of the electrode pad 150 may be provided to be electrically connected to each other.

As an example, as shown in FIG. 14, the first region 151 and the second region 152 of the electrode pad 150 may be provided on one side with respect to the upper surface of the diffusion part 140. The electrode pad 150 may be provided with a width of c1. As an example, the width of c1 may be provided by several hundred micrometers.

The width of c1 may be selected to be large so that the resistance between each of regions of the electrode pad 150 may be neglected. The width of c1 may be selected to be small so as to have a value such that light provided from the semiconductor element 120 does not affect an angle of view of a beam provided to the outside.

In consideration of this point, the width of c1 may be provided at 100 micrometers or more, as an example. In addition, the width of c1 may be provided at 600 micrometers or less, as an example.

In addition, according to an embodiment, the width of c1 may be selected to such a size that the first conductive wire 171 and the second conductive wire 172 may be bonded. In the first region 151 of the electrode pad 150, the connection wiring may be connected to a plurality of points 151a and 151b. Further, in the second region 152 of the electrode pad 150, the connection wiring may be connected to a plurality of points 152a and 152b.

Meanwhile, the above description has been made based on a case in which the electrode pad 150 is provided on the upper surface of the diffusion part 140. However, according to another embodiment, the electrode pad 150 may be provided on a side surface of the diffusion part 140. In addition, the electrode pad 150 may be provided together on the upper surface and the side surface of the diffusion part 140.

The semiconductor element package 100D according to the fifth embodiment may include the circuit board 160.

The circuit board 160 may be disposed under the substrate 110. The substrate 110 may be supported by the circuit board 160. The circuit board 160 may provide a driving power to the semiconductor element 120. The circuit board 160 may be electrically connected to the electrode pad 150.

The circuit board 160 may include a first terminal 161 and a second terminal 162.

The first terminal 161 may be electrically connected to the electrode pad 150. As an example, the first terminal 161 may be electrically connected to the first region 151 of the electrode pad 150. The first terminal 161 and the electrode pad 150 may be electrically connected at a plurality of points 151a and 151b of the first region 151 by a plurality of connection wirings.

The second terminal 162 may be electrically connected to the electrode pad 150. As an example, the second terminal 162 may be electrically connected to the second region 152 of the electrode pad 150. The second terminal 162 and the electrode pad 150 may be electrically connected at a plurality of points 152a and 152b of the second region 152 by the plurality of connection wirings.

The first terminal 161 and the second terminal 162 may be electrically connected to the electrode pad 150 by a conductive wire. As an example, the first terminal 161 and the second terminal 162 may be electrically connected to the electrode pad 150 by a wedge bonding method.

Figure 15:
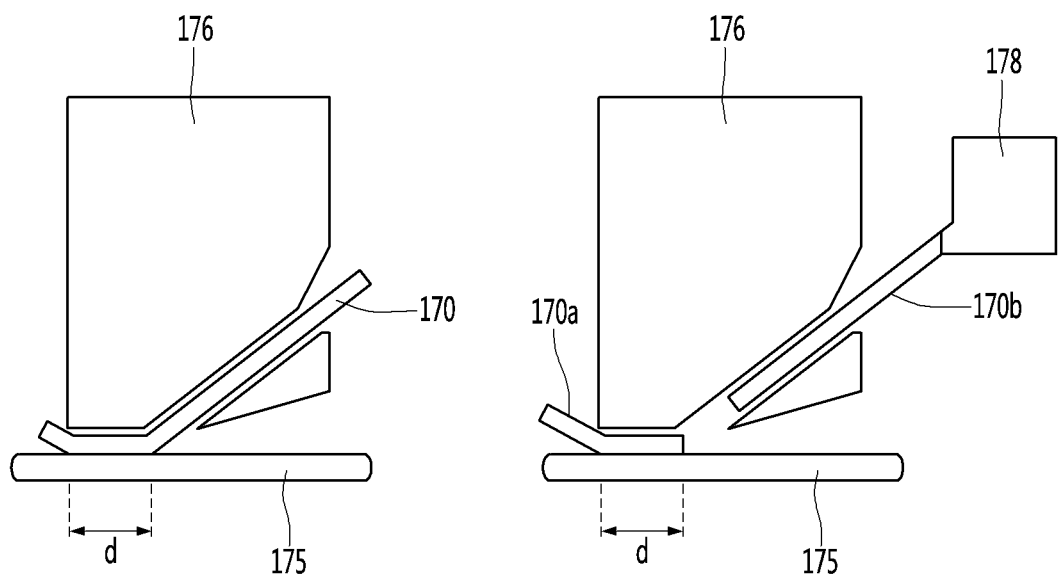
FIG. 15 is a view for describing wedge bonding applied to a method of manufacturing the semiconductor element package according to the fifth embodiment.
Figure 16:
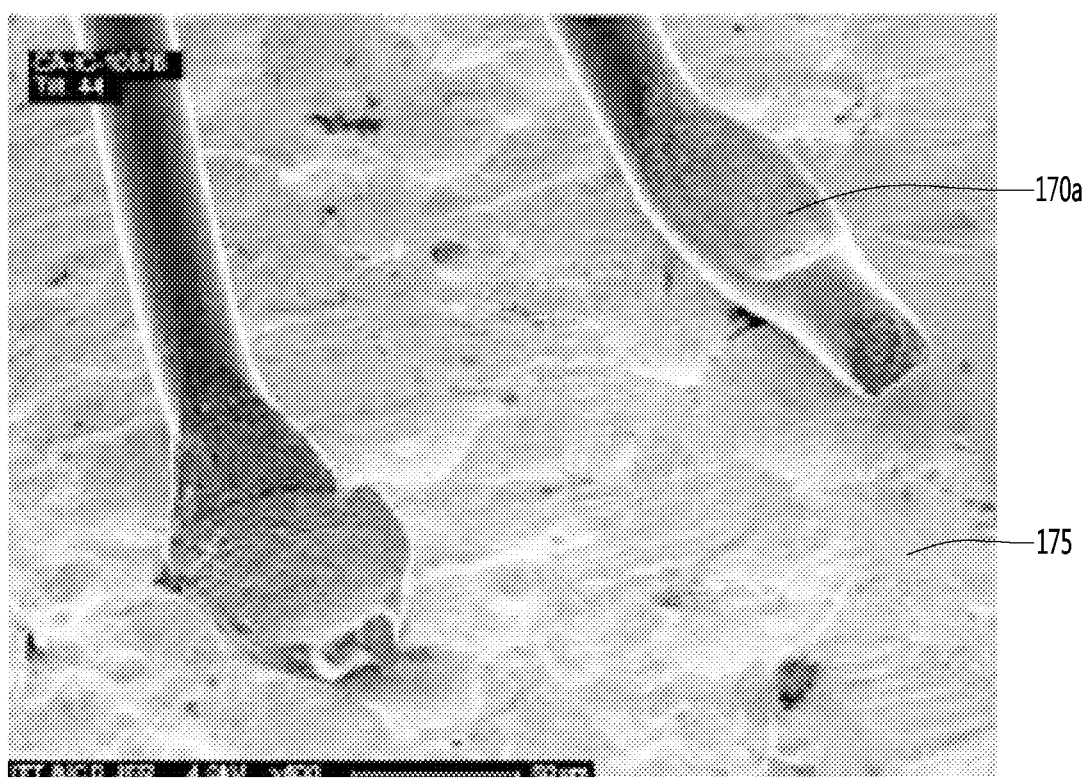
FIG. 16 is a photograph illustrating a shape of a connection wiring wedge-bonded by the method of manufacturing the semiconductor element package according to the fifth embodiment.

FIG. 15 is a view for describing wedge bonding applied to a method of manufacturing the semiconductor element package according to the fifth embodiment, and FIG. 16 is a photograph illustrating a shape of a connection wiring wedge-bonded by the method of manufacturing the semiconductor element package according to the fifth embodiment.

According to the wedge bonding method, as shown in FIG. 15, a wire 170 may be inserted into a wedge 176 and pressed onto a pad 175. At this time, heat and ultrasonic vibration may be transmitted to the wire 170 by a control means 178, and the wire 170 may be separated into a first wire 170a and a second wire 170b. Accordingly, the first wire 170a may be stably bonded to the pad 175 by the wedge 176.

As an example, as shown in FIGS. 15 and 16, the first wire 170a may be pressed and bonded to the pad 175. An upper surface of the first wire 170a may be stably bonded to the pad 175 at a wedge bonding length of "d" in a shape pressed by the wedge 176.

According to an embodiment, the wire 170 may include at least one material selected from the group consisting of Al and Au. Further, the wire 170 may be provided with a diameter of several tens of micrometers to several hundreds of micrometers. As an example, the wire 170 may be provided with a diameter of 75 micrometers to 650 micrometers.

In addition, according to an embodiment, as shown in FIGS. 11 to 14, the first region 151 of the electrode pad 150 and the first terminal 161 may be electrically connected by the first conductive wire 171. The first conductive wire 171 may be disposed in direct contact with an upper surface of the electrode pad 150. Further, the first conductive wire 171 may be disposed in direct contact with an upper surface of the first terminal 161.

The second region 152 of the electrode pad 150 and the second terminal 162 may be electrically connected by the second conductive wire 172. The second conductive wire 172 may be disposed in direct contact with the upper surface of the electrode pad 150. In addition, the second conductive wire 172 may be disposed in direct contact with an upper surface of the second terminal 162.

As an example, the first terminal 161 and the second terminal 162 may include at least one material selected from the group consisting of Cr. Ni. Au, Ti, and Pt, or an alloy thereof. In addition, the first terminal 161 and the second terminal 162 may be provided as Cr/Ni/Au, Ti/Pt/Au, or Ti/Au, as an example.

The housing 130 applied to the semiconductor element package 100D according to the fifth embodiment may be formed in a small volume in which a horizontal length, a vertical length, and a thickness are all several millimeters. As an example, the horizontal length and the vertical length of the housing 130 may be formed between 3 millimeters and 4 millimeters, and the total thickness may be between 1 millimeter and 2 millimeters.

As described above, a distance between the electrode pad 150 and the first terminal 161 or the second terminal 162 may be 1 millimeter or more. Therefore, there is a risk that stability of bonding may be deteriorated when a connection wiring is formed by a generally applicable ball bonding method.

However, according to the semiconductor element package 100D according to the fifth embodiment, it is possible to provide strong bonding force at vibration and durability by applying the wedge bonding method. Therefore, according to the embodiment, the first conductive wire 171 having a stable bonding force may be formed between the electrode pad 150 and the first terminal 161. In addition, the second conductive wire 172 having a stable bonding force may be formed between the electrode pad 150 and the second terminal 162.

Exemplary Embodiment 6

Figure 17:
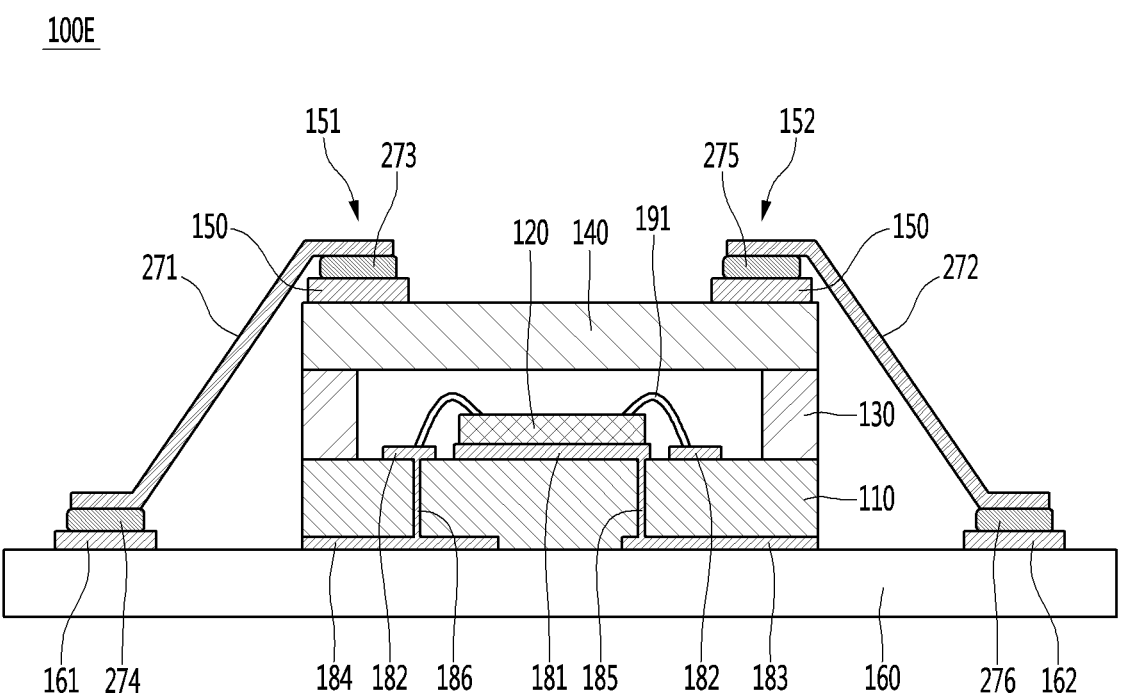
FIG. 17 is a cross-sectional view illustrating a semiconductor element package according to a sixth embodiment.

FIG. 17 is a cross-sectional view illustrating a semiconductor element package according to a sixth embodiment.

Referring to FIG. 17, a description of the semiconductor element package according to the sixth embodiment, which is redundant with the contents described with reference to FIGS. 1 to 16 may be omitted.

Referring to FIG. 17, the semiconductor element package 100E according to the sixth embodiment may include a substrate 110, a semiconductor element 120, a housing 130, and a diffusion part 140.

The semiconductor element 120 may be disposed on the substrate 110. The housing 130 may be disposed on the substrate 110 and around the semiconductor element 120. The diffusion part 140 may be disposed on the housing 130.

Meanwhile, although the diffusion part 140 and the housing 130 may be stably fixed by an adhesive layer, but the possibility that the diffusion part 140 may be separated from the housing 130 in an extreme environment such as long use of the semiconductor element package or vibration may be raised. In this case, when the diffusion part 140 is deviated from the housing 130, strong light emitted from the semiconductor element 120 may be directly irradiated to the outside without passing through the diffusion part 140.

However, when the semiconductor element package 100E according to the sixth embodiment is used to detect movement of a person, strong light not passing through the diffusion part 140 may be directly irradiated to a human eye. As an example, when the strong light emitted from the semiconductor element 120 is directly irradiated to the human eye, there is a risk that the person may lose sight.

Therefore, research is being conducted on a reliable method that may prevent the diffusion part 140 from being separated from the housing 130. In addition, under a stochastic assumption that the diffusion part 140 may be separated from the housing 130 in extreme environments, it is required to provide a stable method that may prevent a person from being injured by the strong light emitted from the semiconductor element 120.

The semiconductor element package 100E according to the sixth embodiment provides a method capable of detecting whether or not the diffusion part 140 and the housing 130 are separated using an electrical signal. According to the sixth embodiment, there is an advantage that deviation of the diffusion part 140 may be detected quickly by providing a detection method using the electrical signal instead of a physical detection method, and subsequent actions associated therewith may be processed quickly.

That is, according to the semiconductor element package 100 according to the sixth embodiment, the deviation of the diffusion part 140 may be detected using the electrical signal, and a driving voltage applied to the semiconductor element 120 may be shut off. Accordingly, it is possible to detect in real time that the diffusion part 140 is deviated from the housing 130, and through the control of the semiconductor element 120, it is possible to fundamentally prevent the strong light emitted from the semiconductor element 120 from being directly irradiated to a person.

The semiconductor element package 100E according to the sixth embodiment may include an electrode pad 150. The electrode pad 150 according to an embodiment may be disposed on the diffusion part 140 in a manner similar to contents described with reference to FIGS. 12 to 14

In addition, the semiconductor element package 100D according to the sixth embodiment may include the circuit board 160.

The circuit board 160 may be disposed under the substrate 110. The substrate 110 may be supported by the circuit board 160. The circuit board 160 may provide a driving power to the semiconductor element 120. The circuit board 160 may be electrically connected to the electrode pad 150.

The circuit board 160 may include a first terminal 161 and a second terminal 162.

The first terminal 161 may be electrically connected to the electrode pad 150. As an example, the first terminal 161 may be electrically connected to the first region 151 of the electrode pad 150.

The second terminal 162 may be electrically connected to the electrode pad 150. As an example, the second terminal 162 may be electrically connected to the second region 152 of the electrode pad 150.

The first terminal 161 and the second terminal 162 may be electrically connected to the electrode pad 150 by a conductive wire. As an example, the first terminal 161 and the second terminal 162 may be electrically connected to the electrode pad 150 by a clip bonding method.

A first region 151 of the electrode pad 150 and the first terminal 161 may be electrically connected by a first conductive clip 271. In addition, a second region 152 of the electrode pad 150 and the second terminal 162 may be electrically connected by a second conductive clip 272.

According to the sixth embodiment, a first bonding layer 273 may be disposed between the first region 151 of the electrode pad 150 and the first conductive clip 271. The first bonding layer 273 may be disposed between an upper surface of the first region 151 and a lower surface of a first region of the first conductive clip 271.

In addition, a second bonding layer 274 may be disposed between the first terminal 161 and the first conductive clip 271. The second bonding layer 274 may be disposed between an upper surface of the first terminal 161 and a lower surface of a second region of the first conductive clip 271.

According to the sixth embodiment, a third bonding layer 275 may be disposed between the second region 152 of the electrode pad 150 and the second conductive clip 272. The third bonding layer 275 may be disposed between an upper surface of the second region 152 and a lower surface of a first region of the second conductive clip 272.

In addition, a fourth bonding layer 276 may be disposed between the second terminal 162 and the second conductive clip 272. The fourth bonding layer 276 may be disposed between an upper surface of the second terminal 162 and a lower surface of a second region of the second conductive clip 272.

According to the clip bonding method, the first conductive clip 271 may be directly bonded to the first bonding layer 273 and the second bonding layer 274 by ultrasonic welding. The ultrasonic welding is a bonding method in which electrical energy is converted into mechanical energy through a vibrator and then transferred to a bonding object through a horn, at this time, melting of a bonding surface occurs and bonding is performed by instantaneous generation of frictional heat at the bonding surface.

The first bonding layer 273, the second bonding layer 274, the third bonding layer 275, and the fourth bonding layer 276 may be formed of at least one material selected from the group consisting of Cu. Al, and Sn. or an alloy thereof. The first bonding layer 273, the second bonding layer 274, the third bonding layer 275, and the fourth bonding layer 276 may be provided to a thickness of several micrometers. For example, the first bonding layer 273, the second bonding layer 274, the third bonding layer 275, and the fourth bonding layer 276 may be provided at 5 to 50 micrometers.

The housing 130 applied to the semiconductor element package 100E according to the sixth embodiment may be formed in a small volume in which a horizontal length, a vertical length, and a thickness are all several millimeters. As an example, the horizontal length and the vertical length of the housing 130 may be formed between 3 millimeters and 4 millimeters, and the total thickness may be between 1 millimeter and 2 millimeters.

As described above, a distance between the electrode pad 150 and the first terminal 161 or the second terminal 162 may be 1 millimeter or more. Therefore, there is a risk that stability of bonding may be deteriorated when a connection wiring is formed by a generally applicable ball bonding method.

However, according to the semiconductor element package 100E according to the sixth embodiment, it is possible to provide strong bonding force at vibration and durability by applying the clip bonding method. Therefore, according to the sixth embodiment, the first conductive wire 171 having a stable bonding force may be formed between the electrode pad 150 and the first clip 271. In addition, the second conductive clip 272 having a stable bonding force may be formed between the electrode pad 150 and the second terminal 162.

Meanwhile, according to the sixth embodiment, the circuit board 160 is electrically connected to the electrode pad 150 provided on the diffusion part 140, and may detect whether or not the diffusion part 140 is separated. The circuit board 160 may be electrically connected to the electrode pad 150, and may detect whether or not the diffusion part 140 is deviated from the housing 130.

The circuit board 160 may include a detection circuit capable of detecting whether or not the diffusion part 140 is separated from the housing 130. The circuit board 160 may detect whether or not the diffusion part 140 is separated from the housing 130, and may control supply of driving power provided to the semiconductor element 120.

According to the sixth embodiment, when the diffusion part 140 is detected to be separated from the housing 130, the circuit board 160 may shut off the driving power supplied to the semiconductor element 120. In addition, when the diffusion part 140 is normally attached on the housing 130, the circuit board 160 may maintain the driving power supplied to the semiconductor element 120.

According to the semiconductor element package 100E according to the sixth embodiment, the first region 151 of the electrode pad 150 disposed on the diffusion part 140 and the first terminal 161 disposed on the circuit board 160 are electrically connected by the first conductive clip 271. In addition, the second region 152 of the electrode pad 150 disposed on the diffusion part 140 and the second terminal 162 disposed on the circuit board 160 are electrically connected by the second conductive clip 272.

At this time, at least one of the first conductive clip 271 and the second conductive clip 272 is broken when the diffusion part 140 is separated from and deviated from the housing 130. Therefore, in the semiconductor element package 100E according to the sixth embodiment, a short circuit detection circuit capable of detecting whether the first conductive clip 271 and the second conductive clip 272 are short-circuited is proposed as a method of detecting whether or not the diffusion part 140 and the housing 130 are separated from each other.

According to the semiconductor element package IOE according to the sixth embodiment, the short circuit detection circuit described with reference to FIG. 6 may be similarly applied. Therefore, a detailed description of the short circuit detection circuit according to the embodiment will be omitted here.

As described above, according to the semiconductor element package 100E of the sixth embodiment, it is possible to detect whether or not the diffusion part 140 is separated by using an electrical signal, and to shut off the driving voltage applied to the semiconductor element 120. Accordingly, in the semiconductor element package 100E according to the sixth embodiment, since it is detected in real time that the diffusion part 140 is deviated from the housing 130, and it is possible to control in real time the driving voltage applied to the semiconductor element 120, strong light emitted from the semiconductor element 120 may be prevented from being directly irradiated to a person.

In addition, according to the semiconductor element package 100E according to the sixth embodiment, the first conductive clip 271 and the second conductive clip 272 may be disposed in plural. Accordingly, the diffusion part 140 has not been separated from and deviated from the housing 130, but when a part of the first conductive clip 271 is short-circuited or a part of the second conductive clip 272 is short-circuited by another external environment, a current may flow normally.

As described above, according to the semiconductor element package 100E according to the sixth embodiment, the semiconductor element 120 may be normally driven even when a part of connection wiring is short-circuited due to the external environment. Accordingly, according to the sixth embodiment, it is possible to prevent occurrence of errors in which the diffusion part 140 is determined to be deviated from the housing 130 when a part of the connection wiring is short-circuited due to the external environment.

Exemplary Embodiment 7

Figure 18:
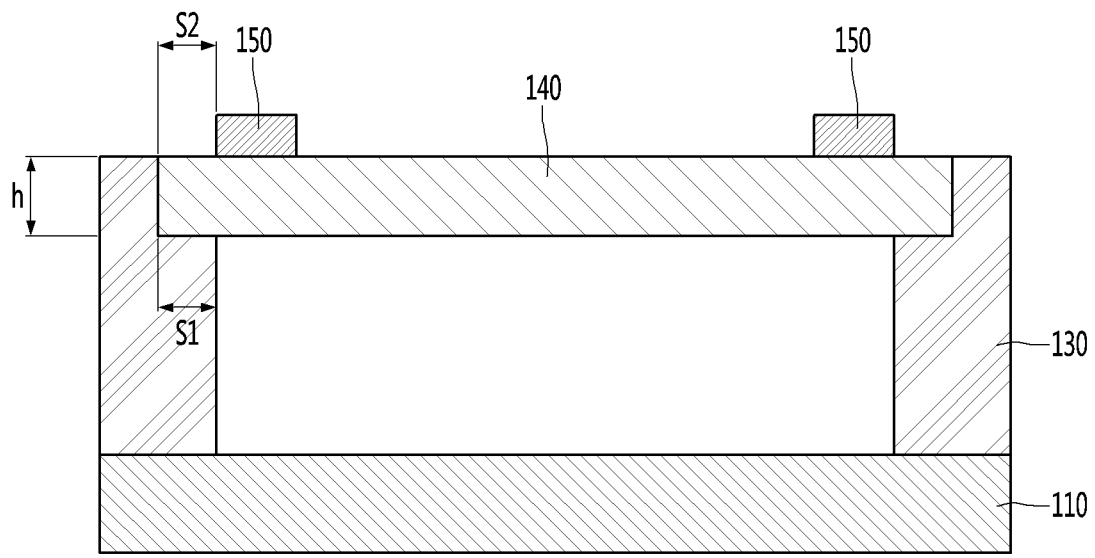
FIG. 18 is a cross-sectional view illustrating a semiconductor element package according to a seventh embodiment.

FIG. 18 is a cross-sectional view illustrating a semiconductor element package according to a seventh embodiment.

Referring to FIG. 18, a description of a semiconductor element package 100 according to an embodiment, which is redundant with the contents described with reference to FIGS. 1 to 17 may be omitted.

Referring to FIG. 18, the semiconductor element package 100F according to the seventh embodiment may include a substrate 110, a housing 130, a diffusion part 140, and an electrode pad 150.

Meanwhile, although a semiconductor element 120 and a circuit board 160 are not shown in FIG. 18 to mainly describe differences of the semiconductor element package 100F according to the seventh embodiment, the semiconductor element 120 and the circuit board 160 may be applied in the same manner as items described with reference to FIGS. 1 to 17.

According to the seventh embodiment, a step may be provided in an upper region of the housing 130. For example, a recessed region provided in the upper region of the housing 130 with a width of S1 and a thickness of h may be provided. As an example, the width of S1 and the thickness of h may be provided by hundreds of micrometers.

In addition, the diffusion part 140 may be disposed in the recessed region. The diffusion part 140 may be supported by the recessed region provided in the upper portion of the housing 130.

In addition, an adhesive layer may be provided between the housing 130 and the diffusion part 140 in the recessed region. As an example, the adhesive layer may be provided on a lower surface and a side surface of the diffusion part 140 in the recessed region.

According to the seventh embodiment, a case in which the adhesive layer provided between the side surface of the diffusion part 140 and the housing 130 overflows to an upper surface of the diffusion part 140 in a process of combining the housing 130 and the diffusion part 140 may occur. When the adhesive layer overflows to the upper surface of the diffusion part 140, the adhesive layer may be provided up to the electrode pad 150.

Meanwhile, when the adhesive layer covers the electrode pad 150, wire peeling may occur during bonding of the connection wiring to the electrode pad 150 described with reference to FIGS. 1 to 17.

In consideration of this point, according to the semiconductor element package 100F according to the seventh embodiment, as shown in FIG. 18, the electrode pad 150 may be disposed to be spaced apart from the side surface of the diffusion part 140 by a distance of S2. Accordingly, even when the adhesive layer provided between the housing 130 and the side surface of the diffusion part 140 overflows the upper surface of the diffusion part 140, the upper surface of the electrode pad 150 may be prevented from being covered with the adhesive layer. In addition, the connection wiring can be stably bonded to the upper surface of the electrode pad 150.

As an example, the distance of S2 may have a value corresponding to the width of S1. S2 may be provided in lengths of several hundred micrometers. As an example, S2 may be set to 400 micrometers. In the seventh embodiment, the 400 micrometer may be a numerical value corresponding to the width of S1 on which the adhesive layer is coated to couple the housing 130 and the diffusion part 140.

Therefore, according to the seventh embodiment, an end of the electrode pad 150 is disposed so as to be spaced apart from the side surface of the diffusion part 140 by a greater distance than the distance of S2, so that an environment in which the connection wirings are stably bonded to the electrode pad 150 may be provided.

Meanwhile, as described above, the semiconductor element packages 100, 100A, 100B, 100C, 100D, 100E, and 100F according to the first to seventh embodiments may include vertical cavity surface emitting laser semiconductor elements.

The vertical cavity surface emitting laser semiconductor elements may convert electrical signals into optical signals. In the vertical cavity surface emitting laser semiconductor element, a circular laser beam may be emitted vertically from the surface of the semiconductor element, unlike a general side emitting laser (LD). Accordingly, the vertical cavity surface emitting laser semiconductor element is easy to connect to a light receiving element, an optical fiber, and the like, and has a merit that parallel signal processing may be performed because a two-dimensional array is easy. In addition, the vertical cavity surface emitting laser semiconductor element has advantages of miniaturization of devices and high density integration, low power consumption, simple manufacturing process, and good heat resistance.

Application fields of the vertical cavity surface emitting laser semiconductor elements may be applied to a laser printer, laser mouse, DVI, HDMI, high speed PCB, home network, etc. in the digital media sector. In addition, the vertical cavity surface emitting laser semiconductor element may be applied to automotive fields such as multimedia networks and safety sensors in automobiles. The vertical cavity surface emitting laser semiconductor elements may also be applied to information communication fields such as Gigabit Ethernet, SAN, SONET and VSR. The vertical cavity surface emitting laser semiconductor element may also be applied to sensor fields such as encoders and gas sensors. In addition, the vertical cavity surface emitting laser semiconductor element may be applied to medical and biotechnological fields such as blood glucose meters and skin care lasers.

An example of a semiconductor element applied to the semiconductor element packages 100, 100A, 100B, 100C, 100D, 100E, and 100F according to the first to seventh embodiments will now be described with reference to FIGS. 19 and 20. That is, at least one of the semiconductor element packages 100, 100A, 100B, 100C, 100D, 1000E and 100F according to the first to seventh embodiments described with reference to FIGS. 1 to 18 may be applied to the semiconductor element.

Figure 19:
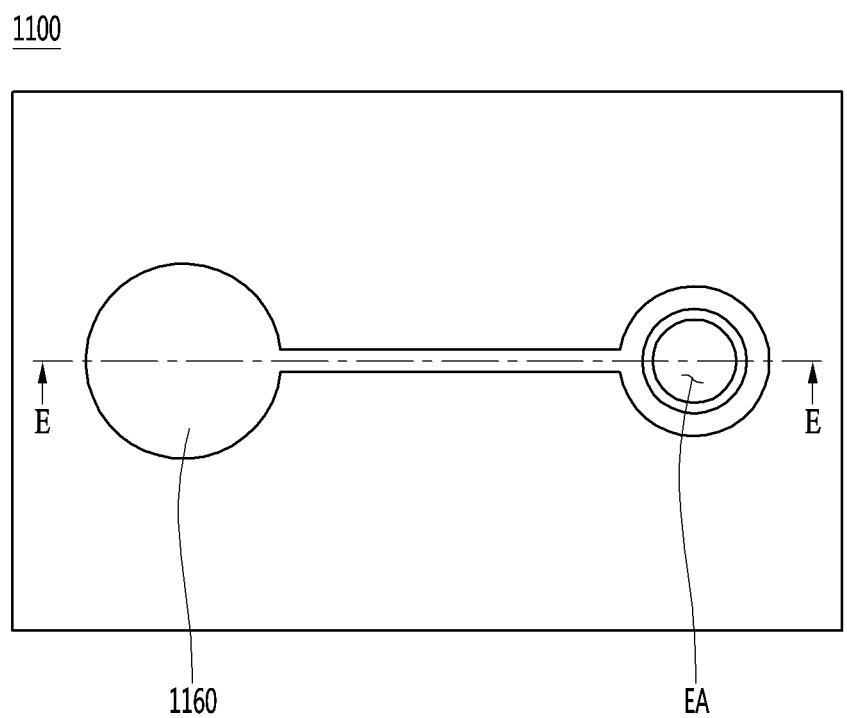
FIG. 19 is a plan view illustrating a semiconductor element according to an embodiment.
Figure 20:
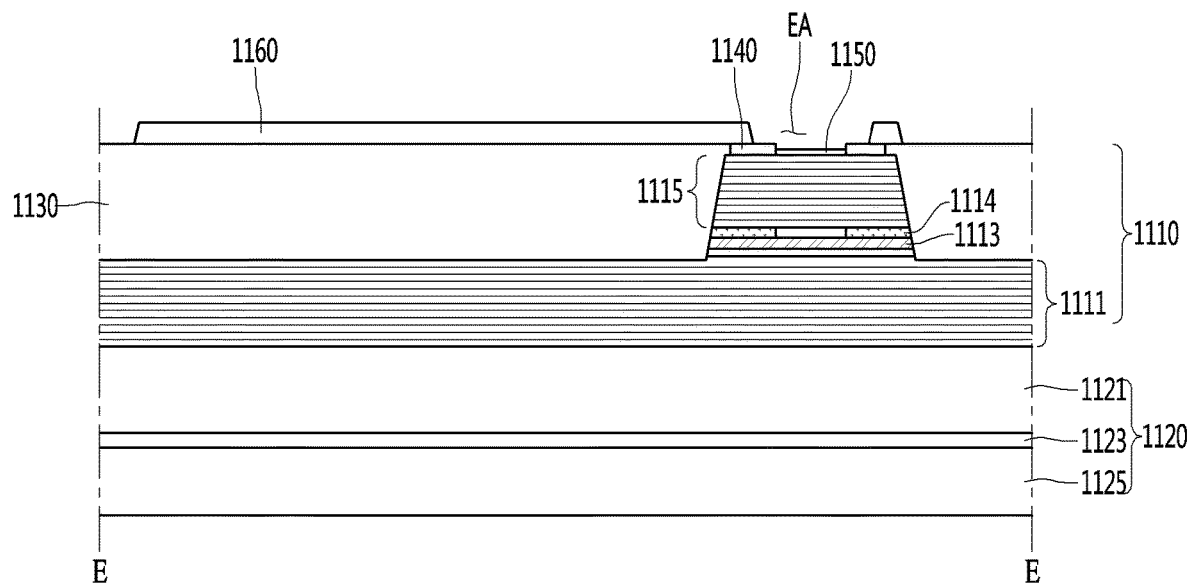
FIG. 20 is a cross-sectional view taken along line E-E of the semiconductor element shown in FIG. 19.

FIG. 19 is a plan view illustrating a semiconductor element according to an embodiment, FIG. 20 is a cross-sectional view taken along line E-E of the semiconductor element shown in FIG. 19.

A semiconductor element 1100 according to an embodiment may be a vertical cavity surface emitting laser (VCSEL) semiconductor element, as shown in FIGS. 19 and 20.

The semiconductor device 1100 according to an embodiment may include a light emitting structure 1110, a first electrode 1120, and a second electrode 1160.

The first electrode 1120 may include an adhesive layer 1121, a substrate 1123, and a first conductive layer 1125.

The adhesive layer 1121 may include a material capable of performing a eutectic bonding. For example, the adhesive layer 1121 may include at least one of AuSn, NiSn or InAu.

The substrate 1123 may be provided with a conductive substrate. The substrate 1123 may be provided with at least one selected from the group consisting of copper (Cu), gold (Au), nickel (Ni), molybdenum (Mo), copper-tungsten (Cu—W), carrier wafers (e.g. Si, Ge, AlN, GaAs, ZnO, SiC and the like). As another example, the substrate 1123 may be provided with a conductive sheet.

Meanwhile, when the substrate 1123 is provided with a suitable carrier wafer such as GaAs, the light emitting structure 110 may be grown on the substrate 1123. In such a case, the adhesive layer 1121 may be omitted.

The first conductive layer 1125 may be disposed under the substrate 1123. The first conductive layer 1125 may be selected from a metal such as Ti, Ru, Rh, Ir, Mg, Zn, Pd, Co, Ni, Si, Ge, Ag and Au, or selective alloys thereof to be provided in a single layer or multiple layers.

The light emitting structure 1110 may include a first semiconductor layer 1111, an active layer 1113, an aperture layer 1114, and a second semiconductor layer 1115 disposed on the first electrode 1120. The light emitting structure 1110 may be grown as a plurality of compound semiconductor layers. The plurality of compound semiconductor layers may be formed by an electron beam evaporator, physical vapor deposition (PVD), chemical vapor deposition (CVD), plasma laser deposition (PLD), dual-type thermal evaporator sputtering, metal organic chemical vapor deposition (MOCVD), and the like.

The first semiconductor layer 1111 may be provided with at least one of Group III-V or Group II-VI compound semiconductors doped with a first conductive type dopant. For example, the first semiconductor layer 1111 may be one of the group consisting of GaAs, Ga Al, InP, InAs, GaP. For example, the first semiconductor layer 1111 may be formed of a semiconductor material having an empirical formula of $Al_xGa_{1-x}As(0<x<1)/Al_yGa_{1-x}As(0<y<1)(y<x)$. The first semiconductor layer 1111 may be an n-type semiconductor layer doped with a first conductive type dopant, for example, an n-type dopant such as Si, Ge, Sn, Se, or Te. The first semiconductor layer 1111 may be a distributed bragg reflector (DBR) having a thickness of $\lambda/4n$ by alternately disposing different semiconductor layers.

The active layer 1113 may be provided with at least one of Group III-V or Group II-VI compound semiconductors.

For example, the active layer 1113 may be one of the group consisting of GaAs, GaAl, InP, InAs, GaP. When the active layer 1113 is implemented as a multi-well structure, the active layer 1113 may include a plurality of well layers and a plurality of barrier layers disposed alternately. The plurality of well layers may be provided, for example, with a semiconductor material having an empirical formula of $In_pGa_{1-p}As$ (0≤p≤1). The barrier layer may be disposed, for example, with a semiconductor material having an empirical formula of $In_qGa_{1-q}As$ (0≤q≤1).

An aperture layer 1114 may be disposed on the active layer 1113. The aperture layer 1114 may include a circular-shaped opening at the center. The aperture layer 1114 may include a function to limit movement of current so that the current is concentrated at the center of the active layer 1113. That is, the aperture layer 1114 may adjust a resonant wavelength and adjust an angle of a beam emitted in the vertical direction from the active layer 1113. The aperture layer 1114 may include an insulating material such as $SiO_2$ or $Al_2O_3$. In addition, aperture layer 1114 may have a higher band gap than the active layer 1113 and the first and second semiconductor layers 1111 and 1115.

The second semiconductor layer 1115 may be provided with at least one of Group III-V or Group II-VI compound semiconductors doped with a second conductive type dopant. For example, the second semiconductor layer 1115 may be one of the group consisting of GaAs, GaAl, InP, InAs, GaP. For example, the second semiconductor layer 1115 may be formed of a semiconductor material having an empirical formula of $Al_xGa_{1-x}As(0<x<1)/Al_yGa_{1-y}As(0<y<1)(y<x)$. The second semiconductor layer 1115 may be an p-type semiconductor layer doped with a second conductive type dopant, for example, an p-type dopant such as Mg, Zn, Ca, Sr, Ba. The second semiconductor layer 1115 may be the DBR having a thickness of λ/4n by alternately disposing different semiconductor layers. The second semiconductor layer 1115 may include a lower reflectance than the first semiconductor layer 1111. For example, the first and second semiconductor layers 1111 and 1115 may form a resonant cavity in the vertical direction by a reflectance of 90% or more. At this time, light may be emitted to the outside through the second semiconductor layer 1115 which is lower than the reflectance of the first semiconductor layer 1111.

The semiconductor device 1100 of an embodiment may include a second conductive layer 1140 provided on the light emitting structure 110. The second conductive layer 1140 is disposed on the second semiconductor layer 1115, and may be disposed along an edge of a light emitting region EA. The second conductive layer 1140 may be of a circular ring type when viewed from above. The second conductive layer 1140 may include an ohmic contact function. The second semiconductor layer 1115 may be provided with at least one of Group III-V or Group I-VI compound semiconductors doped with a second conductive type dopant. For example, the second semiconductor layer 1115 may be one of the group consisting of GaAs, GaAl, InP, InAs, GaP. The second semiconductor layer 1115 may be an p-type semiconductor layer doped with a second conductive type dopant, for example, an p-type dopant such as Mg, Zn, Ca, Sr, Ba.

The semiconductor element 1100 of an embodiment may include a protective layer 1150 provided on the light emitting structure 1110. The protective layer 1150 may be disposed on the second semiconductor layer 1115. The protective layer 1150 may be overlapped the light emitting region EA in the vertical direction.

The semiconductor element 1100 of an embodiment may include an insulating layer 1130. The insulating layer 1130 may be disposed on the light emitting structure 1110. The insulating layer 1130 may include an insulating material such as an oxide, a nitride, a fluoride, a sulfide, or an insulating resin of a material selected from the group consisting of Al, Cr, Si, Ti, Zn and Zr. The insulating layer 1130 may be provided with at least one material selected from the group consisting of, for example, $SiO_2$, $Si_3N_4$, $Al_2O_3$, $TiO_2$. The insulating layer 1130 may be provided in a single layer or multiple layers.

The second electrode 1160 may be disposed on the second conductive layer 1140 and the insulating layer 1130. The second electrode 1160 may be electrically connected to the second conductive layer 1140. The second electrode 1160 may be provided as a single material selected from the group consisting of Ti, Ru, Rh, Ir, Mg, Zn, Al, In, Ta, Pd, Co, Ni, Si, Ge, Ag, and Au, or an alloy thereof. The second electrode 1160 may be provided as a single layer or multiple layers.

Meanwhile, the semiconductor element packages 100, 100A, 100B, 100C, 100D, 100E and 100F according to the first to seventh embodiments described above may be applied to proximity sensors, autofocusing devices, and the like. For example, the autofocusing device according to the embodiment may include a light emitting unit that emits light and a light receiving unit that receives light. At least one of the semiconductor element packages 100, 100A, 100B, 100C, 100D, 100E and 100F according to the first to seventh embodiments described with reference to FIGS. 1 to 18 may be applied as an example of the light emitting unit. As an example of the light receiving unit, a photodiode may be applied. The light receiving unit may receive light reflected from an object by the light emitted from the light emitting unit.

The autofocusing device may be applied to a variety of applications such as a mobile terminal, a camera, a vehicle sensor, and an optical communication device. The autofocusing device may be applied to various fields for multi-position detection for detecting the position of a subject.

Figure 21:
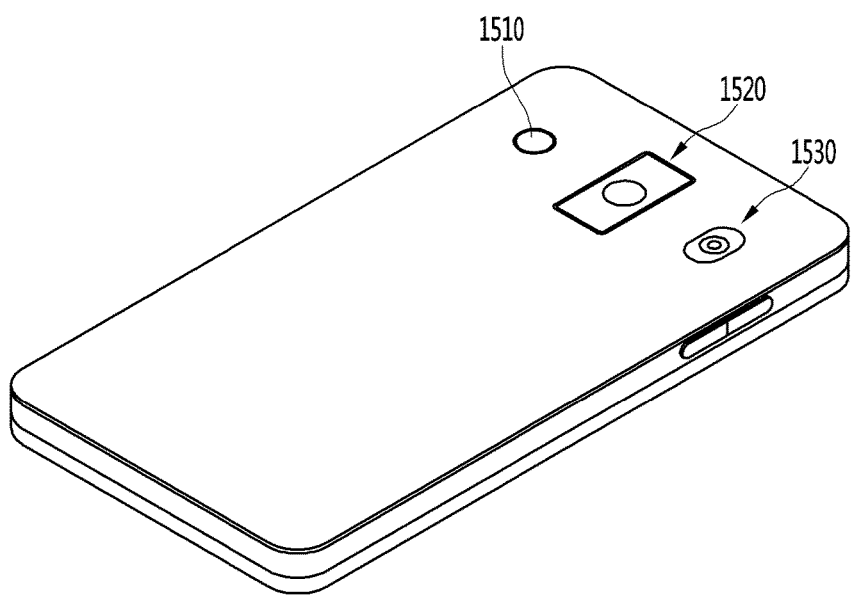
FIG. 21 is a perspective view of a mobile terminal to which an autofocusing device including a semiconductor element package according to an embodiment is applied.

FIG. 21 is a perspective view of a mobile terminal to which an autofocusing device including a semiconductor element package according to an embodiment is applied.

As shown in FIG. 21, a mobile terminal 1500 of an embodiment may include a camera module 1520, a flash module 1530, and an autofocusing device 1510 provided on the rear side. Here, the autofocusing device 1510 may include one of the semiconductor element packages 100, 100A, 100B, 100C, 100D, 100E, and 100F according to the first to seventh embodiments described with reference to FIGS. 1 to 18 as the light emitting unit.

The flash module 1530 may include a light emitting element that emits light therein. The flash module 1530 may be operated by the camera operation of the mobile terminal or by the user's control. The camera module 1520 may include an image capture function and an autofocus function. For example, the camera module 1520 may include an autofocus function using an image.

The autofocusing device 1510 may include an autofocusing function using a laser. The autofocusing device 1510 may be used mainly in a condition where the autofocus function using the image of the camera module 1520 is degraded, for example, in a close-up of 10 m or less or dark environment. The autofocusing device 1510 may include a light emitting unit including the vertical cavity surface emitting laser (VCSEL) semiconductor element and a light receiving unit that converts light energy into electrical energy such as a photodiode.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in the embodiments may be varied. In addition, it should be construed that differences related to such a variation and such an application are included in the scope of the present invention defined in the following claims.

INDUSTRIAL APPLICABILITY

Embodiments can be applied to, for example, proximity sensors, autofocus devices, and the like.

The autofocus device can be applied to a variety of applications such as a mobile terminal, a camera, a vehicle sensor, and an optical communication device. The autofocusing apparatus can be applied to various fields for multi-position detection for detecting the position of a subject.

The invention claimed is:

1. A semiconductor element package comprising:
a first substrate;
a second substrate disposed under the first substrate and including a first signal line and a second signal line;
a semiconductor element disposed on the first substrate;
first and second electrodes disposed on the first substrate, and electrically connected to the semiconductor element;
a housing disposed on the first substrate, disposed around the semiconductor element, and having a step in an upper region thereof;
a first via hole and a second via hole passing through the first substrate and the housing;
a diffusion part disposed at the step of the housing, and disposed on the semiconductor element;
a pad disposed along an edge of a lower surface of the diffusion part; and
a sensing part connected to the pad and disposed in the first substrate and the housing,
wherein the sensing part comprises:
a first sensing electrode connected to a first portion of the pad; and
a second sensing electrode connected to a second portion of the pad,
wherein the first sensing electrode comprises:
a first bonding portion contacting the first portion of the pad in the step of the housing;
a first connection wiring connected to the first bonding portion and disposed in the first via hole; and
a second bonding portion connected to the first connection wiring and disposed under the first substrate,
wherein the second sensing electrode comprises:
a third bonding portion contacting the second portion of the pad in the step of the housing;
a second connection wiring connected to the third bonding portion and disposed in the second via hole; and
a fourth bonding portion connected to the second connection wiring and disposed under the first substrate, and
wherein the second bonding portion is connected to the first signal line and the fourth bonding portion is connected to the second signal line.

2. The semiconductor element package of claim 1, wherein the pad has a width greater than a width of each of the first bonding portion and the third bonding portion.

3. The semiconductor elementpackage of claim 1, further comprising:
an adhesive layer between each of the first bonding portion and the third bonding portion and the pad.

4. The semiconductor element package of claim 1, further comprising:
a protective layer surrounding the housing and the first substrate.

5. The semiconductor element package of claim 4, wherein the protective layer is disposed along an edge of an upper surface of the diffusion part.

6. The semiconductor element package of claim 4, wherein the protective layer comprises:
a first region disposed along an edge of an upper surface of the diffusion part; and
a second region extending from the first region and contacting an upper surface of the second substrate via an outer side surface of the housing.

7. The semiconductor element package of claim 1, wherein the pad comprises a conductor.

8. The semiconductor element package of claim 1, wherein the pad has a closed-loop shape.

* * * * *